United States Patent
Hoppenjans et al.

(10) Patent No.: US 9,979,372 B2
(45) Date of Patent: May 22, 2018

(54) RECONFIGURABLE MICROWAVE FILTERS

(71) Applicant: Indiana Microelectronics, LLC, West Lafayette, IN (US)

(72) Inventors: Eric E. Hoppenjans, West Lafayette, IN (US); Steven J. Cuppy, Monticello, IN (US)

(73) Assignee: Indiana Microelectronics, LLC, West Lafayette, IN (US)

( * ) Notice: Subject to any disclaimer, the term of this patent is extended or adjusted under 35 U.S.C. 154(b) by 243 days.

(21) Appl. No.: 14/695,662

(22) Filed: Apr. 24, 2015

(65) Prior Publication Data

US 2017/0040978 A1     Feb. 9, 2017

Related U.S. Application Data

(60) Provisional application No. 61/984,408, filed on Apr. 25, 2014.

(51) Int. Cl.
*H03H 7/01* (2006.01)
*H03H 7/00* (2006.01)
(Continued)

(52) U.S. Cl.
CPC .......... *H03H 7/0153* (2013.01); *H01P 1/208* (2013.01); *H01P 1/2053* (2013.01); *H01P 7/04* (2013.01);
(Continued)

(58) Field of Classification Search
CPC .. H03H 7/12; H03H 9/24; H03H 9/02; H03H 7/0123; H03L 7/04; H03L 7/081;
(Continued)

(56) References Cited

U.S. PATENT DOCUMENTS 7,726,189 B2   6/2010   Vyas et al.
8,446,222 B2   5/2013   Brenndorfer
(Continued)

FOREIGN PATENT DOCUMENTS

EP     2282404 A1     2/2011
EP     2144370 B1     2/2012

OTHER PUBLICATIONS

Sigmarsson, et al., "In-Situ Control of Tunable Evanescent-Mode Cavity Filters Using Differential Mode Monitoring", IMS, Boston, 2009, pp. 633-636.*

(Continued)

*Primary Examiner* — Benny Lee
*Assistant Examiner* — Hafizur Rahman
(74) *Attorney, Agent, or Firm* — Barnes & Thornburg LLP

(57) ABSTRACT

Illustrative embodiments of reconfigurable microwave filters, as well as associated systems and methods, are disclosed. In at least one illustrative embodiment, a reconfigurable microwave filter may comprise a plurality of cavity resonators on a common substrate and a plurality of control circuits each configured to control a resonant frequency of one of the plurality of cavity resonators. The reconfigurable microwave filter may also comprise a plurality of feedback circuits each configured to generate a feedback signal that is indicative of the resonant frequency of one of the plurality of cavity resonators and to transmit the feedback signal to one of the plurality of control circuits.

25 Claims, 19 Drawing Sheets

(51) Int. Cl.
*H01P 1/205* (2006.01)
*H01P 7/04* (2006.01)
*H01P 1/208* (2006.01)
*H03J 1/06* (2006.01)

(52) U.S. Cl.
CPC .......... *H03H 7/004* (2013.01); *H03H 7/0123* (2013.01); *H03J 1/06* (2013.01)

(58) Field of Classification Search
CPC ...... H03F 1/00; H03J 3/20; H03J 1/06; H01P 1/20; H01P 1/2053; H01P 1/208; H01P 7/06
USPC ........................................................ 333/17.1
See application file for complete search history.

(56) References Cited

U.S. PATENT DOCUMENTS

| | | | |
|---|---|---|---|
| 8,598,969 | B1 | 12/2013 | Walker et al. |
| 8,665,040 | B1* | 3/2014 | Chappell ............... H01P 1/2039 333/174 |
| 2007/0046397 | A1 | 3/2007 | Bajaj et al. |
| 2007/0257750 | A1* | 11/2007 | Tilmans .................... H01P 7/06 333/231 |
| 2011/0241802 | A1 | 10/2011 | Joshi et al. |
| 2012/0299651 | A1 | 11/2012 | Goel et al. |
| 2014/0055203 | A1 | 2/2014 | Villard |

OTHER PUBLICATIONS

ISA/KR, Search Report and Written Opinion for PCT/US2015/027599, dated Mar. 31, 2016, 8 pages.
Arif, Muhammad Shoaib et al., "All-Silicon Technology for High-Q Evanescent Mode Cavity Tunable Resonators and Filters," Journal of Microelectromechanical Systems, Jun. 2014, vol. 23, No. 3.
Naglich, Eric J. et al., "Tunable, Substrate Integrated, High Q Filter Cascade for High Isolation," Microwave Symposium Digest (MTT), 2010 IEEE MTT-S International.
Joshi, Himanshu et al., "High-Q Fully Reconfigurable Tunable Bandpass Filters," IEEE Transactions on Microwave Theory and Techniques, Dec. 2009, vol. 57, No. 12.
Joshi, Himanshu et al., "Tunable High Q Narrow-Band Triplexer," Department of Electrical and Computer Engineering, Birck Nanotechnology Center, Purdue University, West Lafayette, Indiana, 47907, USA, Microwave Symposium Digest, 2009. MTT '09. IEEE MTT-S International.
Joshi, Himanshu et al., "High Q Narrow-Band Tunable Filters with Controllable Bandwidth," Department of Electrical and Computer Engineering, Birck Nanotechnology Center, Purdue University, West Lafayette, Indiana, 47907, USA, Microwave Symposium Digest, 2009. MTT '09. IEEE MTT-S International.
Liu, Xiaoguang et al., "High-Q Tunable Microwave Cavity Resonators and Filters using SOI-based RF MEMS Tuners," Journal of Microelectromechanical Systems, Feb. 2010.
Hoppenjans, Eric E. et al., "A Vertically Integrated Tunable UHF Filter," Purdue University, 465 Northwestern Ave., West Lafayette, IN 47907, Microwave Symposium Digest (MTT), 2010 IEEE MTT-S International.
Naglich, Eric J. et al., "Bandpass-Bandstop Filter Cascade Performance Over Wide Frequency Tuning Ranges," Microwave Theory and Techniques, IEEE Transactions on, vol. 58, No. 12., Dec. 2010.
Lee, Juseop et al., "Frequency-Agile Field-Programmable Filter Array (FPFA) with Multiple Functionalities," School of Electrical and Computer Engineering, Purdue University, West Lafayette, 47906, USA, Microwave Symposium Digest (MTT), 2011 IEEE MTT-S International, 2011.
Lee, Juseop et al., "Tunable Inter-Resonator Coupling Structure With Positive and Negative Values and Its Application to the Field-Programmable Filter Array (FPFA)," IEEE Transactions on Microwave Theory and Techniques, Dec. 2011, vol. 59, No. 12.
Liu, Xiaoguang, "High-Q RF MEMS Tunableresonators and Filters for Reconfigurable Radio Frequency Front-Ends," A Dissertation Submitted to the Faculty of Purdue University, In Partial Fulfillment of the Requirements for the Degree of Doctor of Philosophy, Aug. 2010, Purdue University, West Lafayette, Indiana.
Fathelbab, Wael M. et al., "A Reconfigurable Bandpass Filter for RF/Microwave Multifunctional Systems," IEEE Transactions on Microwave Theory and Techniques, Mar. 2005, vol. 53, No. 3.
Joshi, Himanshu et al., "A Fast High-Q X-band RF-MEMS Reconfigurable Evanescent-Mode Cavity Resonator," IEEE Transactions on Microwave Theory and Techniques, Dec. 2009, vol. 57, No. 12.
Lu Julia Hsin-Lin et al., "A Low-Power, Wide-Dynamic-Range Semi-Digital Universal Sensor Readout Circuit Using Pulsewidth Modulation," IEEE Sensors Journal, May 2011, vol. 11, No. 5.
Rogers RO4000 Series of Laminates, Apr. 2014, http://www.rogerscorp.com/documents/726/acm/RO4000-Laminates.
Chen, Kenle et al., "Power Handling of High-Q Evanescent-Mode Tunable Filter with Integrated Piezoelectric Actuators," IEEE, 2012.

\* cited by examiner

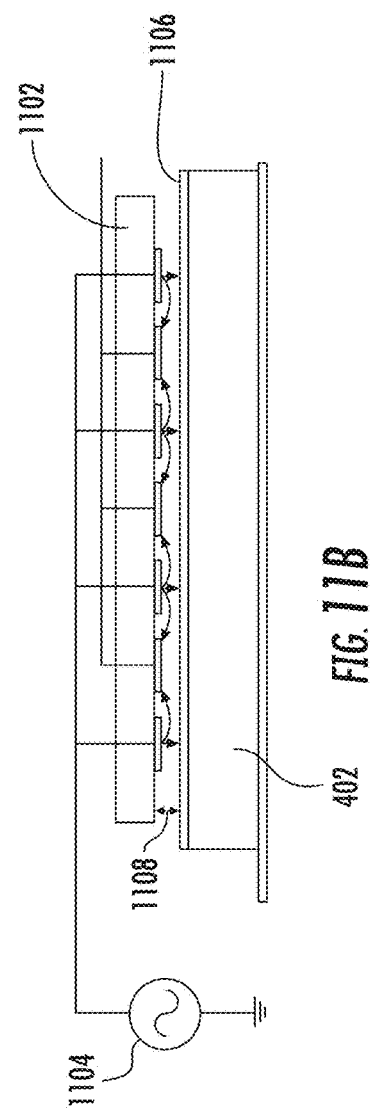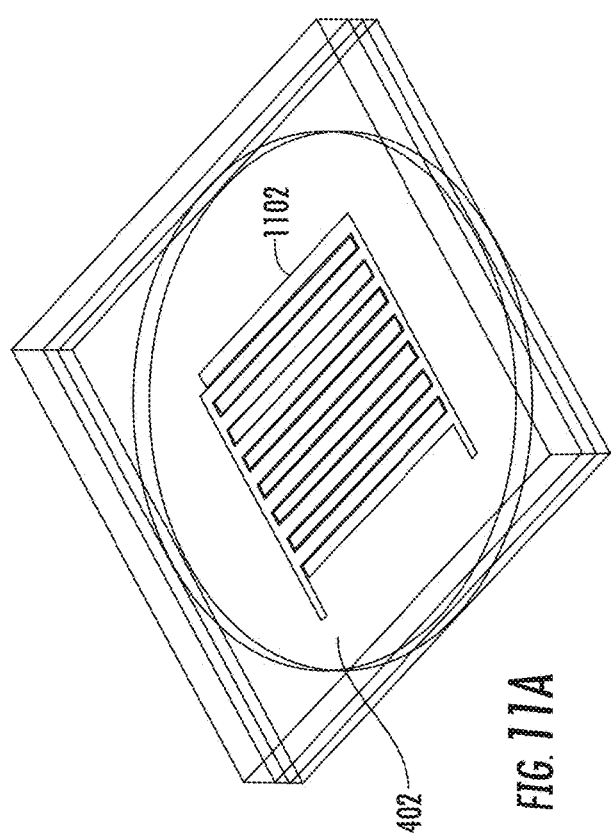

RECONFIGURABLE MICROWAVE FILTERS

CROSS-REFERENCE TO RELATED APPLICATION

This application claims the benefit of U.S. Provisional Patent Application No. 61/984,408, filed Apr. 25, 2014 (entitled "Reconfigurable Microwave Filter with Automatic Feedback and Control for Stabilized Programmable Center Frequency and Bandwidth"), the entire disclosure of which is incorporated by reference herein.

STATEMENT REGARDING FEDERALLY SPONSORED RESEARCH

This invention was made with government support under Contract Nos. W31P4Q-13-C-016 and W31P4Q-12-C-0210 awarded by DARPA and Contract Nos. N00164-13-C-GR38 and N00014-11-M-0305 awarded by the United States Navy. The government has certain rights in the invention.

TECHNICAL FIELD

The present disclosure relates, generally, to filters and, more particularly, to reconfigurable microwave filters (RMFs).

BACKGROUND

Electronic systems used by armed forces (e.g., voice communications, data communications, satellite communications, telemetry, navigation, radar, electronic warfare, and/or electronic counter measure systems) may suffer from degraded efficacy resulting, for example, from co-site interference and/or jamming. Co-site interference is due to multiple electronic systems, typically located at or near the same physical location (e.g., co-located), electrically interfering with one another. For example, naval vessels often suffer from co-site interference because of numerous antennas and other electronic systems being located on or around the vessel's mast. Jamming has two typical forms: hostile and unintentional. Hostile jamming occurs when an entity intentionally broadcasts radio frequency (RF) signals with the intent of disrupting or disabling electronic systems (e.g., land- or vessel-based electronic systems of adversarial armed forces). Unintentional jamming occurs when an entity broadcasts RF signals that have the unintentional consequence of disrupting or disabling electronics systems. Various techniques have been employed in an effort to mitigate co-site interference and/or jamming including, for example, frequency planning, spatial separation, static filters, tunable filters (e.g., Yttrium Iron Garnet, or YIG, filters), time sharing, directional antennae, and digital signal processing techniques, each of which suffers from various practical limitations.

SUMMARY

According to one aspect, a reconfigurable microwave filter may comprise a plurality of cavity resonators electrically coupled in series, a plurality of control circuits, and a plurality of feedback circuits. Each control circuit of the plurality of control circuits may be capacitively coupled to a corresponding cavity resonator of the plurality of cavity resonators different from a cavity resonator to which each other control circuit of the plurality of control circuits is capacitively coupled and may be configured to control a resonant frequency of the corresponding cavity resonator by varying a capacitance of a center post of the corresponding cavity resonator. Each feedback circuit of the plurality of feedback circuits may be associated with a corresponding cavity resonator of the plurality of cavity resonators and may be configured to generate a feedback signal that is indicative of the resonant frequency of the corresponding cavity resonator and to transmit the feedback signal to the control circuit of the plurality of control circuits that is capacitively coupled to the corresponding cavity resonator.

In some embodiments, each control circuit may comprise a piezoelectric actuator capacitively coupled to the corresponding cavity resonator. Each feedback circuit may be configured to sense a capacitance associated with the corresponding piezoelectric actuator and to modulate a pulse width of the feedback signal based on the sensed capacitance. Each feedback circuit may comprise an inductance that forms a resonant tank circuit with a capacitance associated with the corresponding piezoelectric actuator, and each feedback circuit may be configured to generate the feedback signal based on the resonant frequency of the resonant tank circuit. Each feedback circuit may comprise an interdigitated capacitor sensor capacitively coupled to the corresponding piezoelectric actuator, and each feedback circuit may be configured to generate the feedback signal based on a capacitance of the interdigitated capacitor. Each feedback circuit may comprise an additional cavity resonator, the corresponding piezoelectric actuator may also be capacitively coupled to the additional cavity resonator of the associated feedback circuit, and each feedback circuit may be configured to generate the feedback signal based on a resonant frequency of the additional cavity resonator.

In some embodiments, each control circuit may comprise a micro-electro-mechanical systems (MEMS) membrane capacitively coupled to the corresponding cavity resonator. The MEMS membrane may comprise a segmented MEMS membrane including a plurality of MEMS membranes. Each feedback circuit may be configured to sense a capacitance associated with the corresponding MEMS membrane and to modulate a pulse width of the feedback signal based on the sensed capacitance. Each feedback circuit may comprise an inductance that forms a resonant tank circuit with a capacitance associated with the corresponding MEMS membrane, and each feedback circuit may be configured to generate the feedback signal based on the resonant frequency of the resonant tank circuit. Each feedback circuit may comprise an interdigitated capacitor sensor capacitively coupled to the corresponding MEMS membrane, and each feedback circuit may be configured to generate the feedback signal based on a capacitance of the interdigitated capacitor. Each feedback circuit may comprise an additional cavity resonator, the corresponding MEMS membrane may also be capacitively coupled to the additional cavity resonator of the associated feedback circuit, and each feedback circuit may be configured to generate the feedback signal based on a resonant frequency of the additional cavity resonator.

In some embodiments, the center post of the corresponding cavity resonator may be a split post divided by a gap into a plurality of sections, and the feedback signal may be based on a measurement of a differential mode of the corresponding cavity resonator. Each control circuit may be configured to adjust the resonant frequency of the corresponding cavity resonator based on the feedback signal received from the associated feedback circuit. Each control circuit may be configured to compare the received feedback signal to a reference signal indicative of a desired resonant frequency of the corresponding cavity resonator and adjust the resonant frequency of the corresponding cavity resonator based on the comparison of the received feedback signal to the reference signal. Each control circuit of the plurality of control circuits may be configured to control the resonant frequency of the corresponding cavity resonator independent of control of each other cavity resonator.

In some embodiments, a first control circuit of the plurality of control circuits may be configured to control a resonant frequency of a first cavity resonator of the plurality of cavity resonators, and a second control circuit of the plurality of control circuits may be configured to control a resonant frequency of a second cavity resonator of the plurality of cavity resonators independent of the control of the resonant frequency of the first cavity resonator. The second control circuit may be configured to control the resonant frequency of the second cavity resonator to be different from the resonant frequency of the first cavity resonator.

According to another aspect, a method of operating a reconfigurable microwave filter may comprise controlling, by a control circuit, a resonant frequency of a cavity resonator based on a desired resonant frequency of the cavity resonator; measuring, by a feedback circuit, a capacitance associated with the control circuit, wherein the measured capacitance is indicative of the resonant frequency of the cavity resonator; generating, by the feedback circuit, a feedback signal that is indicative of the resonant frequency of the cavity resonator; and adjusting, by the control circuit, the resonant frequency of the cavity resonator based on the feedback signal.

In some embodiments, the method may further comprise receiving, by the control circuit, a control signal indicative of the desired resonant frequency of the cavity resonator from a host system. Adjusting the resonant frequency of the cavity resonator may comprise comparing the feedback signal to the control signal and adjusting the resonant frequency of the cavity resonator based on the comparison of the feedback signal to the control signal.

According to yet another aspect, an electronic system may comprise a reconfigurable microwave filter including a plurality of cavity resonators on a common substrate and a plurality of control circuits. Each control circuit of the plurality of control circuits may be configured to independently control a resonant frequency of a corresponding cavity resonator of the plurality of cavity resonators different from a cavity resonator that each other control circuit of the plurality of control circuits independently controls.

In some embodiments, the plurality of cavity resonators may be electrically coupled in series. In other embodiments, the plurality of cavity resonators may be electrically coupled in parallel. In still other embodiments, the plurality of cavity resonators may be electrically coupled in a series-parallel configuration.

In some embodiments, each control circuit may be configured to receive a feedback signal indicative of a figure-of-merit of the electronic system and to adjust the resonant frequency of the corresponding cavity resonator based on the received feedback signal. The feedback signal may be indicative of a bit-error rate associated with the electronic system. The feedback signal may be indicative of a signal-to-noise ratio associated with the electronic system.

In some embodiments, each cavity resonator may comprise a plurality of solid state varactors. In other embodiments, each control circuit may comprise a piezoelectric actuator capacitively coupled to the corresponding cavity resonator. In still other embodiments, each control circuit may comprise a micro-electro-mechanical systems (MEMS) membrane capacitively coupled to the corresponding cavity resonator.

BRIEF DESCRIPTION

The concepts described in the present disclosure are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

FIG. 11A is a perspective view of at least one embodiment of the feedback circuitry of the reconfigurable microwave filter of FIG. 1 that utilizes RF injection feedback;

FIG. 11B is an elevation view of the feedback circuitry of FIG. 11A;

DETAILED DESCRIPTION

While the concepts of the present disclosure are susceptible to various modifications and alternative forms, specific exemplary embodiments thereof have been shown by way of example in the figures and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the present disclosure.

Figure 1:
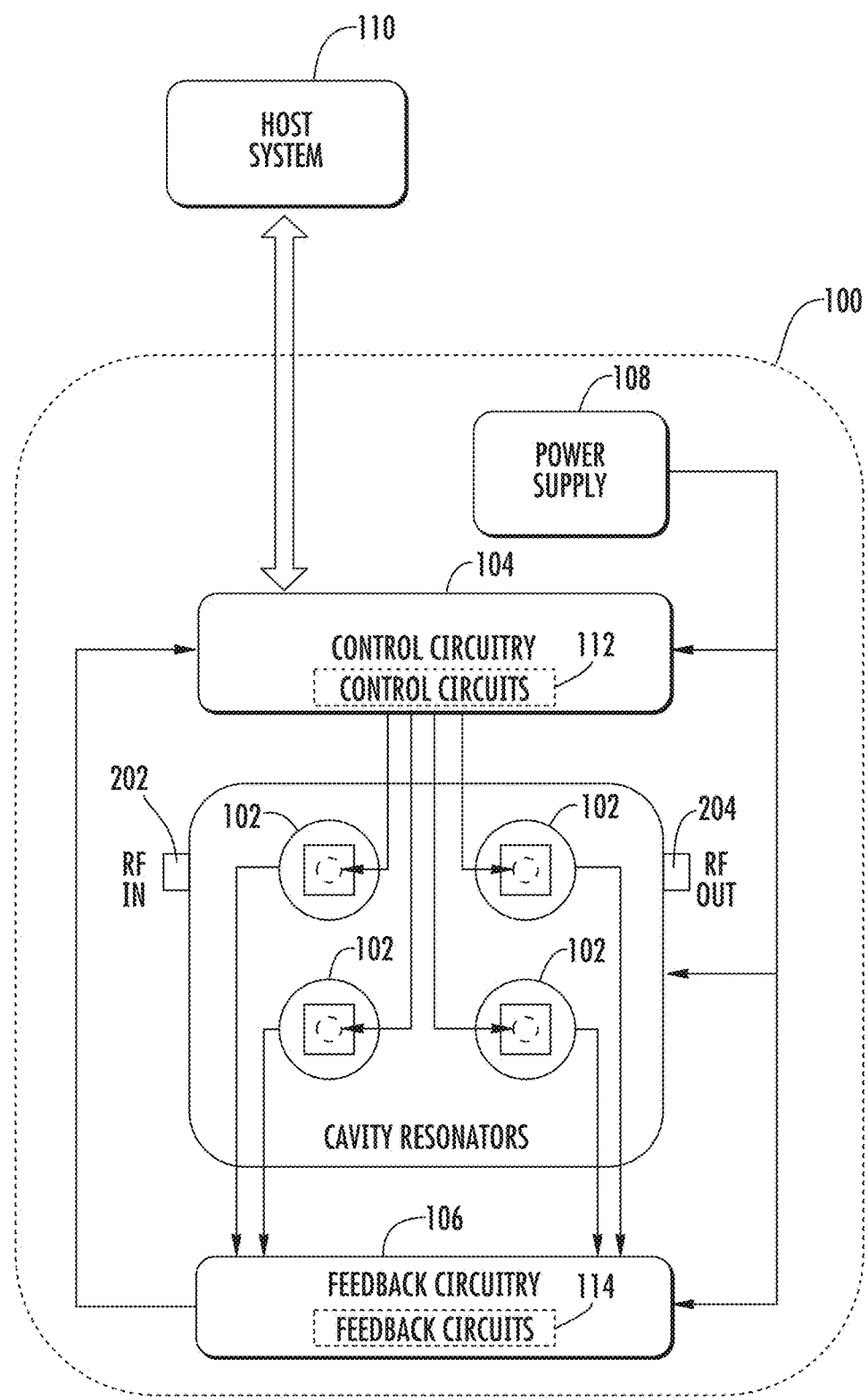
FIG. 1 is a simplified diagram of at least one embodiment of a reconfigurable microwave filter.

Referring now to FIG. 1, a reconfigurable microwave filter 100 includes a plurality of cavity resonators 102, control circuitry 104, feedback circuitry 106, and a power supply 108. Additionally, as shown, the illustrative reconfigurable microwave filter 100 may be communicatively coupled to a host system 110. As described in detail below, various parameters of the reconfigurable microwave filter 100 may be dynamically configurable, depending on the particular embodiment. For example, in some embodiments, the center frequency ($f_c$) and/or the bandwidth ($\Delta f$) of the reconfigurable microwave filter 100 may be user-programmable. In other words, a user may change such parameters of the reconfigurable microwave filter 100 in real-time subsequent to the manufacture of the reconfigurable microwave filter 100 (i.e., subsequent to the initial parameter set-up). As such, it will be appreciated that the reconfigurable microwave filter 100 may be dynamically programmed, for example, as a bandpass filter, a bandstop filter, or as a notch filter (i.e., a bandstop filter with a narrow $\Delta f$) by modifying various parameters of the reconfigurable microwave filter 100.

Each of the cavity resonators 102 is embodied as a physical structure having a cavity defined therein, such that electromagnetic waves reflect about the walls of the cavity and RF energy at a resonant frequency is either passed or stopped. Accordingly, it will be appreciated that the cavity resonators 102 may serve as building blocks for bandpass and/or bandstop filters. The cavity resonators 102 may be fabricated from standard printed circuit board substrates (e.g., FR4 or organic substrates), silicon, glass, and/or another suitable material depending on the desired frequencies and the particular embodiment. For example, in some embodiments, the cavity resonators 102 may be fabricated from standard substrates for frequencies from approximately 1 GHz to 20 GHz and from silicon or glass for frequencies greater than 20 GHz.

Figure 2:
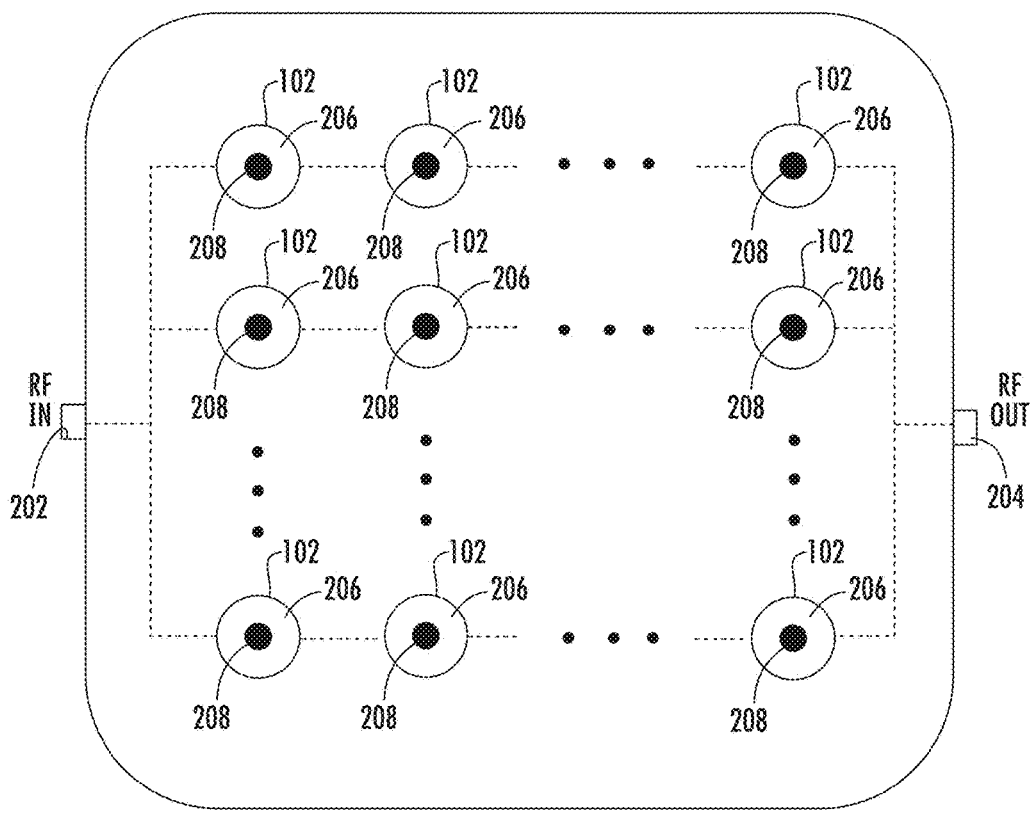
FIG. 2 is a simplified diagram illustrating numerous possible arrangements of cavity resonators of the reconfigurable microwave filter of FIG. 1.
Figure 3:
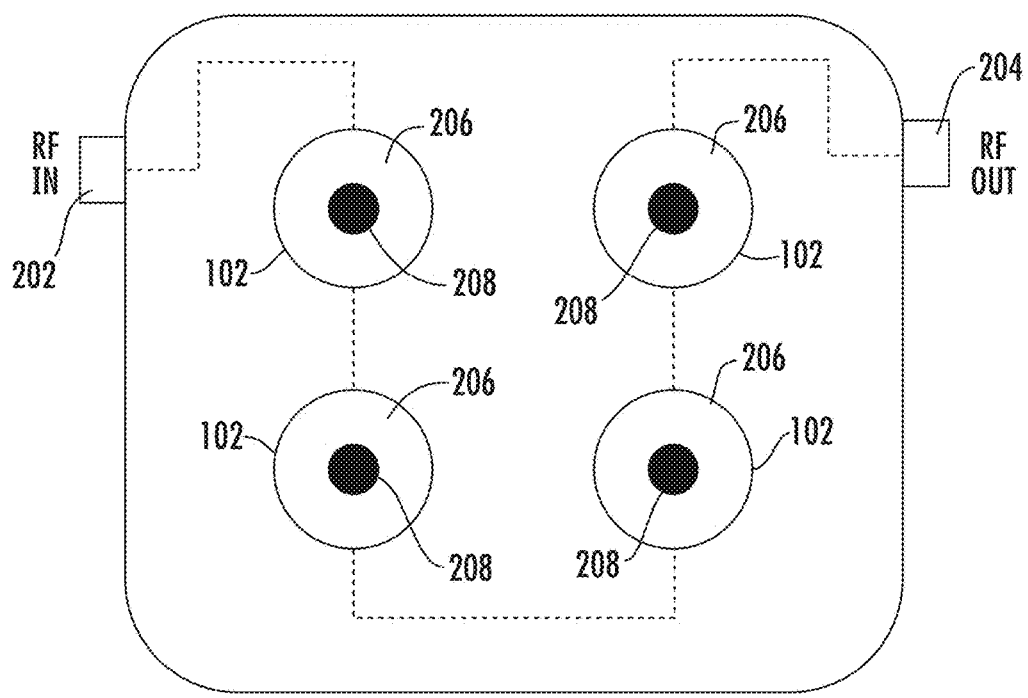
FIG. 3 is a simplified diagram of one illustrative embodiment of the cavity resonators of the reconfigurable microwave filter of FIG. 1.

As shown in FIG. 2, the plurality of cavity resonators 102 may include any number of cavity resonators 102, which may be arranged in any suitable physical, electrical, and/or electromagnetic configuration. For example, in some embodiments, the cavity resonators 102 may be electrically arranged between an RF input connector 202 and a RF output connector 204 in series and/or in parallel, depending on the desired characteristics of the reconfigurable microwave filter 100. As suggested in FIG. 2, the cavity resonators 102 may be arranged in any number of parallel "branches" and, similarly, each of the parallel "branches" may include any number of cavity resonators 102 arranged in series. It will be appreciated that each cavity resonator 102 corresponds with one pole of the resulting reconfigurable microwave filter 100. For example, in the embodiment of FIG. 3, the reconfigurable microwave filter 100 includes four cavity resonators 102 arranged in series, which results in a four-pole reconfigurable microwave filter 100. In some embodiments, the RF input connector 202 and the RF output connector 204 may be embodied as a subminiature version A (SMA) connector, a subminiature version B (SMB) connector, a type N connector, a Bayonet Neill-Concelman (BNC) connector, and/or another suitable RF connector. In other embodiments, the reconfigurable microwave filter 100 may not include such connectors but instead may utilize, for example, bond pads.

Each of the cavity resonators 102 includes a cavity 206 and a center post 208. In some embodiments, one or more of the cavity resonators 102 may include a cavity 206 having a radius between 4.0 and 8.0 millimeters and a thickness of between 0.7 millimeters and 3.0 millimeters and a center post 208 having a radius between 0.2 and 3.0 millimeters. Of course, the particular dimensions may vary depending, for example, on the desired frequency range of the reconfigurable microwave filter 100. It will be appreciated that the resonant frequency of a particular cavity resonator 102 may be changed by varying the capacitance of the center post 208 of that cavity resonator 102.

Referring back to FIG. 1, the control circuitry 104 is configured to control the resonant frequencies of the cavity resonators 102 by varying the capacitances of the corresponding center posts 208 of those cavity resonators 102. In the illustrative embodiment, the control circuitry 104 includes a plurality of control circuits 112 such that each of the control circuits 112 is configured to control a resonant frequency of a separate cavity resonator 102 (e.g., by virtue of a capacitive coupling between the control circuit 112 and the corresponding cavity resonator 102). In some embodiments, a control circuit 112 may control the corresponding cavity resonator 102 independent of the control of the other cavity resonators 102. As such, the cavity resonators 102 may be controlled to operate at the same or different resonant frequencies depending on the particular embodiment. However, it will be appreciated that, in some embodiments, the control of a particular cavity resonator 102 may be dependent on the control and/or various parameters of one or more of the other cavity resonators 102. As described in reference to FIGS. 4-7 below, each of the control circuits 112 may be embodied as a piezoelectric actuator, a MEMS membrane, or a variable capacitor (varactor), depending on the particular embodiment. Of course, in other embodiments, the control circuits 112 may be otherwise embodied and/or utilize additional or alternative techniques for controlling the resonant frequency of the cavity resonators 102.

The feedback circuitry 106 is configured to generate feedback signals indicative of the resonant frequencies of the cavity resonators 102. Further, in some embodiments, the feedback circuitry 106 transmits feedback signals to the control circuitry 104 (e.g., to establish closed loop control of the cavity resonators 102). In the illustrative embodiment, the feedback circuitry 106 includes a plurality of feedback circuits 114 such that each of the feedback circuits 114 is configured to generate a feedback signal that is indicative of the resonant frequency of a separate cavity resonator 102. In some embodiments, a feedback circuit 114 may generate feedback signals associated with sensed characteristics of a cavity resonator 102 independent of characteristics of the other cavity resonators 102. In other embodiments, the feedback circuitry 106 may include only a single feedback circuit 114 configured to generate one or more feedback signals for each of the cavity resonators 102. For example, in some embodiments, the feedback circuitry 106 may utilize figure of merit optimization (FMO) control based on an overall characteristic of the electronic system incorporating the reconfigurable microwave filter 100. In particular, the figure of merit optimization may involve optimizing some statistical measure, for example, by maximizing a signal-to-noise ratio (SNR) or minimizing a bit error rate (BER) associated with the electronic system incorporating the reconfigurable microwave filter 100.

In some embodiments, the feedback circuitry 106 may be integrated with or form a portion of the control circuitry 104. The feedback circuitry 106 may measure the resonant frequencies of the cavity resonators 102 directly or indirectly depending on the particular embodiment. As described in reference to FIGS. 8-17, each of the feedback circuits 114 may be configured to utilize capacitance to pulse width modulation (C2PWM) feedback, voltage controlled oscillator (VCO) feedback, RF injection feedback, pulse injection feedback, or split post feedback, depending on the particular embodiment. Of course, the feedback circuits 114 may utilize other feedback sensing and/or feedback signal generation techniques in other embodiments. It is contemplated that any of the feedback circuits 114 described herein may be utilized with any of the control circuits 112 described herein.

In the illustrative embodiment, the control circuitry 104 receives programmed values from the host system 110 for the desired (target) resonant frequencies of the cavity resonators 102 and controls the cavity resonators 102 in an attempt to keep the actual resonant frequencies of the cavity resonators 102 as close to the desired resonant frequencies as possible (e.g., via closed loop control). In doing so, the control circuitry 104 receives the feedback signals from the feedback circuitry 106 and adjusts the resonant frequency of the cavity resonator(s) 102 based on those feedback signals in real-time. In particular, a control circuit 112 may compare the received feedback signal to a reference signal indicative of a desired resonant frequency of the corresponding cavity resonator 102 (e.g., the programmed target frequency) and adjust the resonant frequency of the cavity resonator 102 based on the comparison.

The power supply 108 is configured to provide the necessary power to the various reconfigurable microwave filter 100 components. In some embodiments, the power supply 108 may be embodied as an independent alternating current (AC) or direct current (DC) power source, whereas in other embodiments, the power supply 108 may receive power from an external source (e.g., a utility power grid). The power supply 108 may perform various power-related functions including, for example, AC-DC conversion, power conditioning, DC-DC conversion, and/or other suitable power-related functions.

As described above, the host system 110 may be used to program and reprogram the reconfigurable microwave filter 100. For example, the host system 110 may transmit the desired resonant frequencies for the cavity resonators 102 to the control circuitry 104 over a suitable wired or wireless communication link. The host system 110 may be embodied as any type of computing device/component capable of performing the functions described herein. For example, the host system 110 may be embodied as a desktop computer, laptop computer, tablet computer, notebook, netbook, Ultrabook™, smartphone, cellular phone, wearable computing device, personal digital assistant, mobile Internet device, smart device, microcontroller, server, router, switch, Hybrid device, and/or any other computing/communication device. As such, the host system 110 may include a processor, a memory, an input/output subsystem, data storage, a communication circuitry, peripheral devices, and/or other components commonly found in a typical computing device. Additionally, in some embodiments, one or more of the illustrative components may be incorporated in, or otherwise form a portion of, another component (e.g., as part of a system-on-a-chip (SoC).

Figure 4:
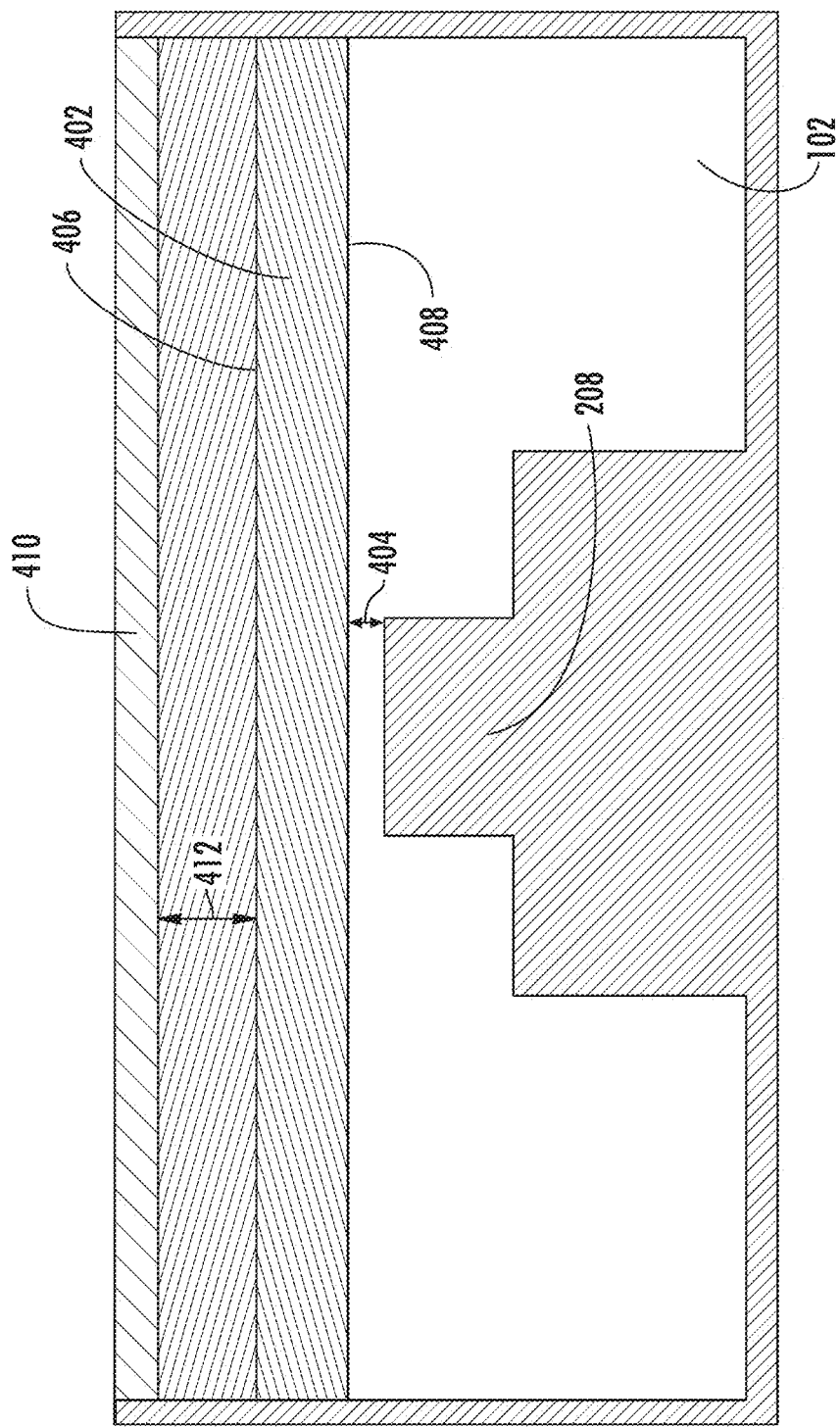
FIG. 4 is a cross-sectional view of at least one embodiment of control circuitry of the reconfigurable microwave filter of FIG. 1 that includes a piezoelectric actuator.

As shown in FIG. 4 and indicated above, one or more of the control circuits 112 of the reconfigurable microwave filter 100 may be embodied as or include a piezoelectric actuator 402. The piezoelectric actuator 402 may be used to control the capacitance of the corresponding cavity resonator 102 to realize a target resonant frequency. In some embodiments, a capacitance ($C_{GAP}$) is established across a center post gap 404 between the piezoelectric actuator 402 and the center post 208 of the cavity resonator 102. The piezoelectric actuator 402 may be biased on a top 406 and a bottom 408 of the piezoelectric actuator 402 by a high voltage DC signal.

It will be appreciated that by adjusting the high voltage DC bias, the piezoelectric actuator 402 will move nearer or farther from the center post 208, which will change the capacitance ($C_{GAP}$) across the center post gap 404. In some embodiments, voltage increases cause the piezoelectric actuator 402 to move nearer the center post 208 and increase the capacitance ($C_{GAP}$) of the center post gap 404, and voltage decreases cause the piezoelectric actuator 402 to move farther from the center post 208 and decrease the capacitance ($C_{GAP}$) of the center post gap 404. In such embodiments, as the capacitance ($C_{GAP}$) increases, the center frequency of the cavity resonator 102 decreases and as the capacitance ($C_{GAP}$) decreases, the center frequency of the cavity resonator 102 increases. The corresponding feedback circuit 114 senses a capacitance ($C_{SENSE}$) of a gap 412 between the piezoelectric actuator 402 and a conductive cap 410. As described below, the capacitance ($C_{SENSE}$) may be utilized by the feedback circuit 114 in order to determine the resonant frequency at which the cavity resonator 102 is resonating.

Figure 5:
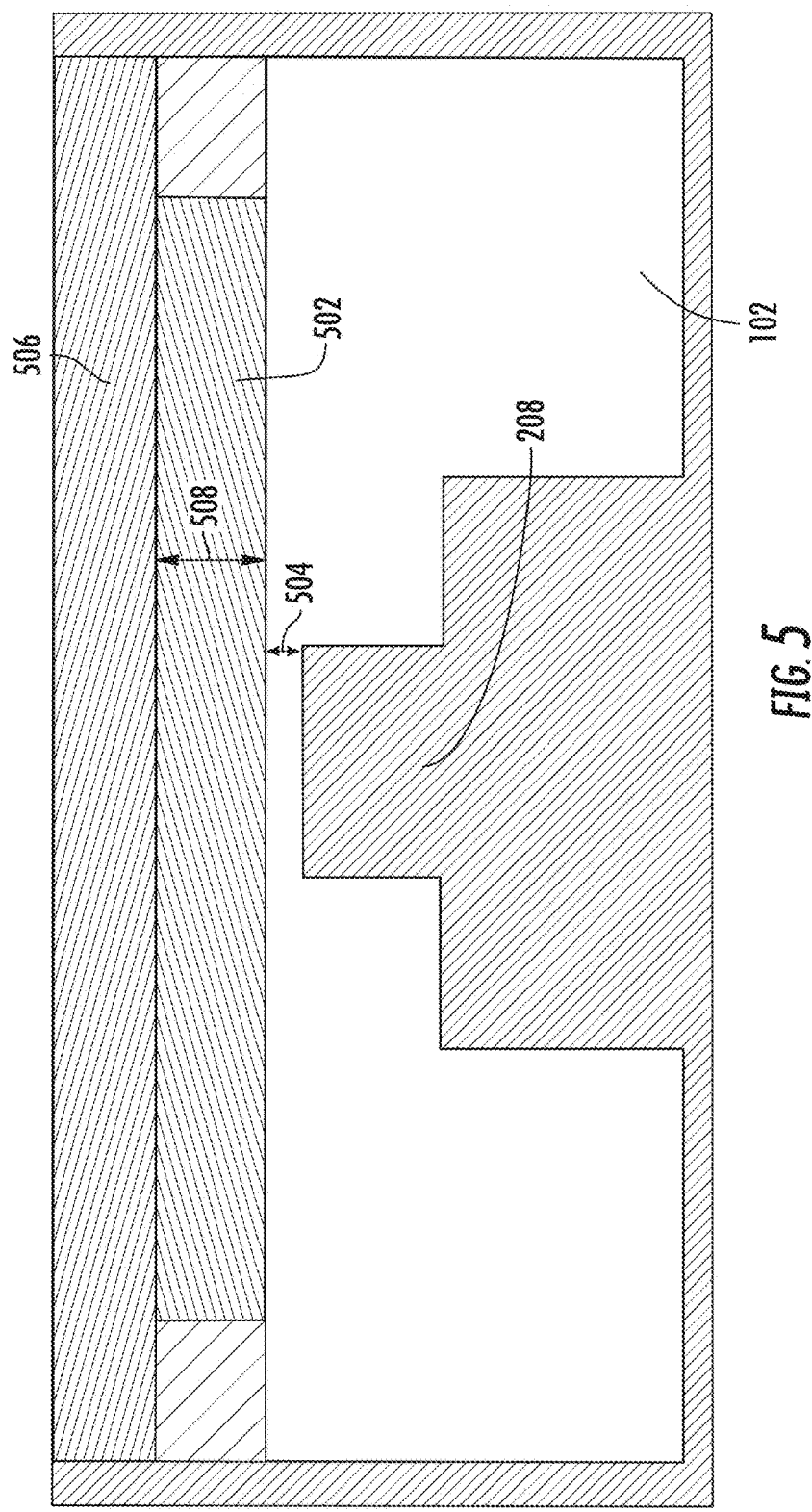
FIG. 5 is a cross-sectional view of at least one embodiment of the control circuitry of the reconfigurable microwave filter of FIG. 1 that includes a Micro-Electro-Mechanical Systems (MEMS) membrane actuator.

Referring now to FIG. 5, one or more of the control circuits 112 may be embodied as or include a MEMS membrane. A MEMS membrane 502 may be used to control a capacitance ($C_{GAP}$) of a center post gap 504 between the MEMS membrane 502 and the center post 208 of the corresponding cavity resonator 102. In some embodiments, a bias electrode 506 serves to control the capacitance ($C_{GAP}$) between the center post 208 and the MEMS membrane 502 and to measure a capacitance ($C_{SENSE}$) of a gap 508 between the MEMS membrane 502 and the bias electrode 506. Similar to the piezoelectric actuator 402, the control circuit 112 may change the DC voltage on the bias electrode 506 in order to move the MEMS membrane 502 nearer or farther from the center post 208 and therefore change the capacitance ($C_{GAP}$) of the center post gap 504. However, unlike the piezoelectric actuator 402, a bias voltage increase causes the MEMS membrane 502 to move farther from the center post 208, which decreases the capacitance ($C_{GAP}$) of the center post gap 504. In some embodiments, a high speed MEMS membrane may be utilized, which may operate in a manner similar to that described above with respect to the MEMS membrane 502 but with a faster tuning speed. It will be appreciated that the membrane of a high speed MEMS membrane is constructed of a plurality of individual smaller MEMS membranes to form a segmented MEMS membrane, which exhibits faster tuning speeds than a homogeneous MEMS membrane.

Figure 6:
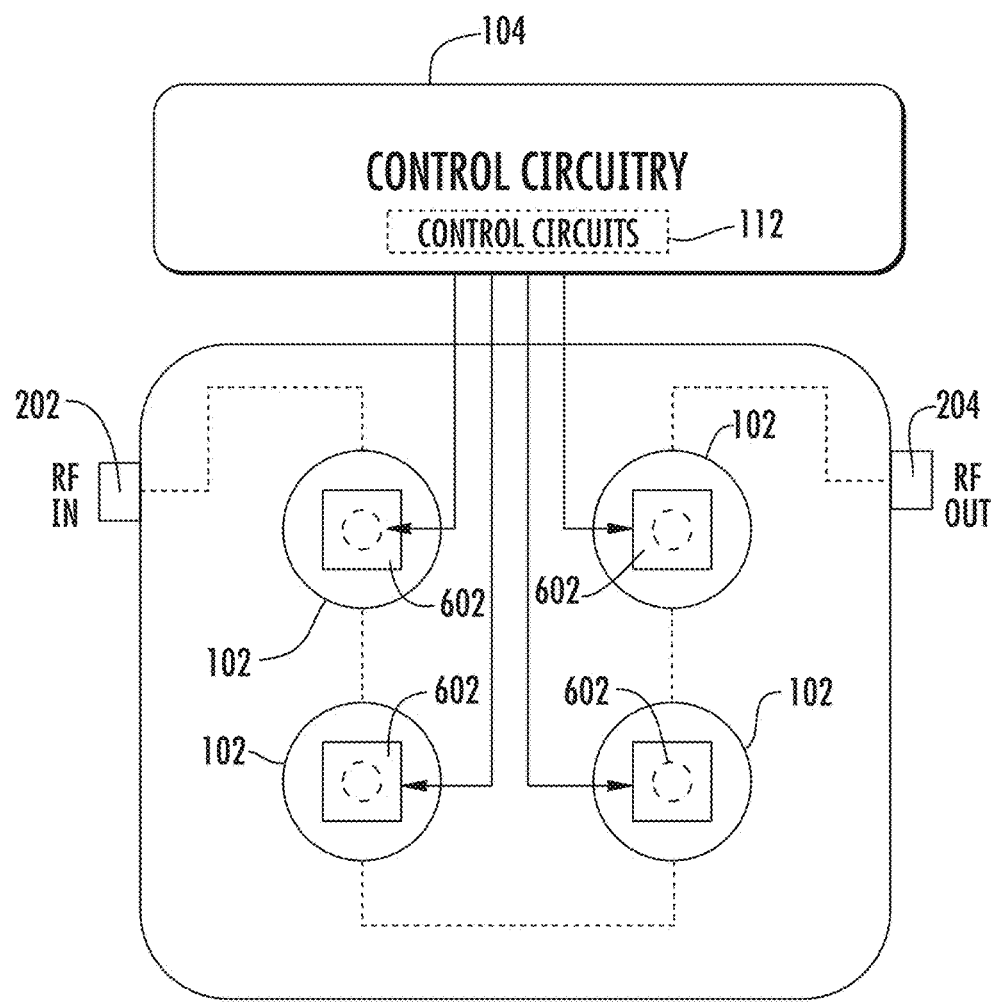
FIG. 6 is a simplified diagram of at least one embodiment of the reconfigurable microwave filter of FIG. 1 that includes variable capacitors.
Figure 7:
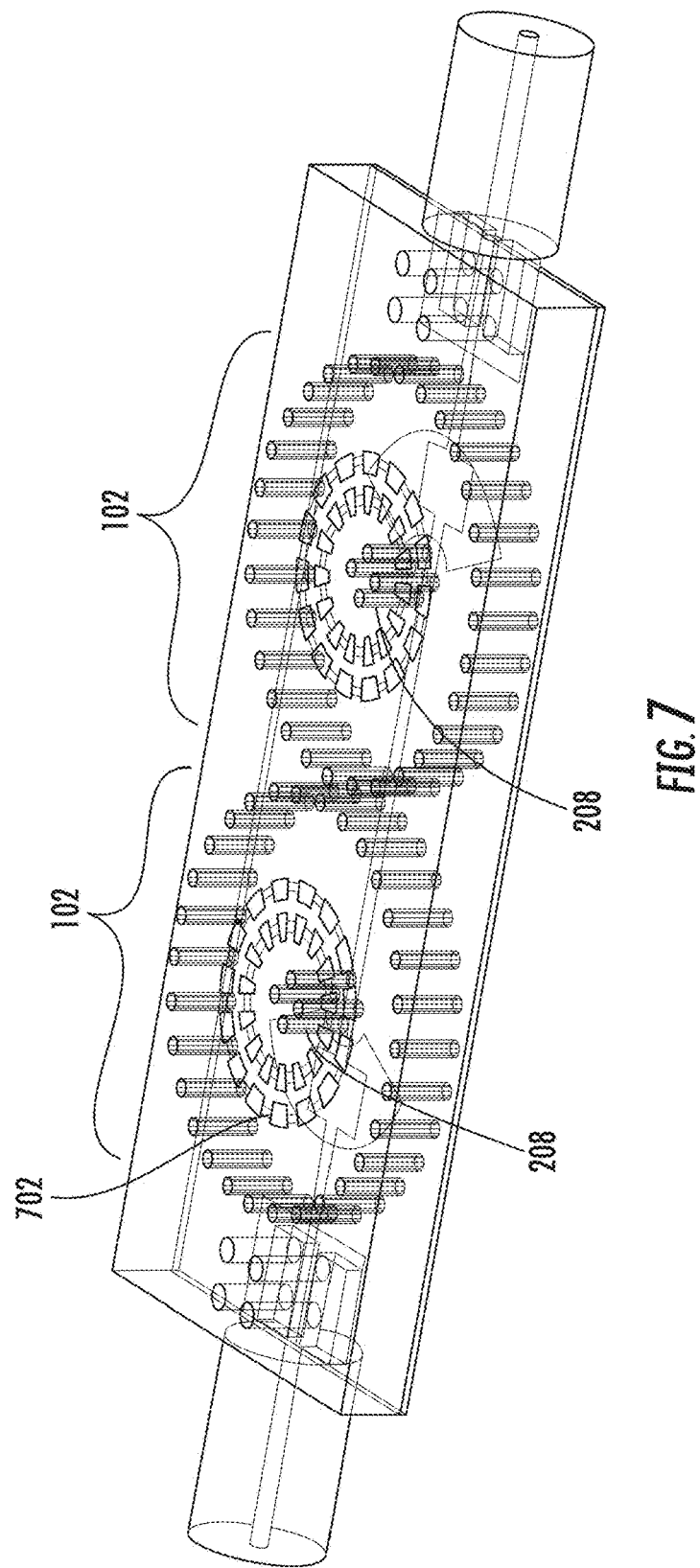
FIG. 7 is a perspective view of at least one embodiment of the reconfigurable microwave filter of FIG. 1 that includes two cavity resonators with variable capacitors.

Referring now to FIG. 6, the reconfigurable microwave filter 100 may include variable capacitors 602, each of which are positioned around (e.g., surrounding) the center post 208 of the corresponding cavity resonator 102. In such embodiments, the capacitance of the center post 208 may be adjusted by applying bias voltage(s) to the variable capacitors 602. It will be appreciated that the variable capacitors 602 may be embodied as solid state variable capacitors (varactors). Referring now to FIG. 7, a two pole notch filter that utilizes such varactors is shown. As indicated above, each pole of the filter uses a cavity resonator 102. As such, the illustrative two pole notch filter includes two cavity resonators 102. The center post 208 of each cavity resonator 102 is capacitively coupled to the cavity's outer perimeter, and the capacitance is formed by a plurality of varactors 702 arranged in a wagon wheel (or hub and spoke) configuration. It will be appreciated that a wagon wheel design serves to keep the magnetic fields within the resonator uniformly distributed in order to increase the quality of the filter 100. Further, in some embodiments in which varactors 702 are used, the reconfigurable microwave filter 100 does not include the feedback circuitry 106. Instead, a lookup table and/or measurements of a figure of merit, for example, may be utilized to control the cavity resonators 102.

Figure 8:
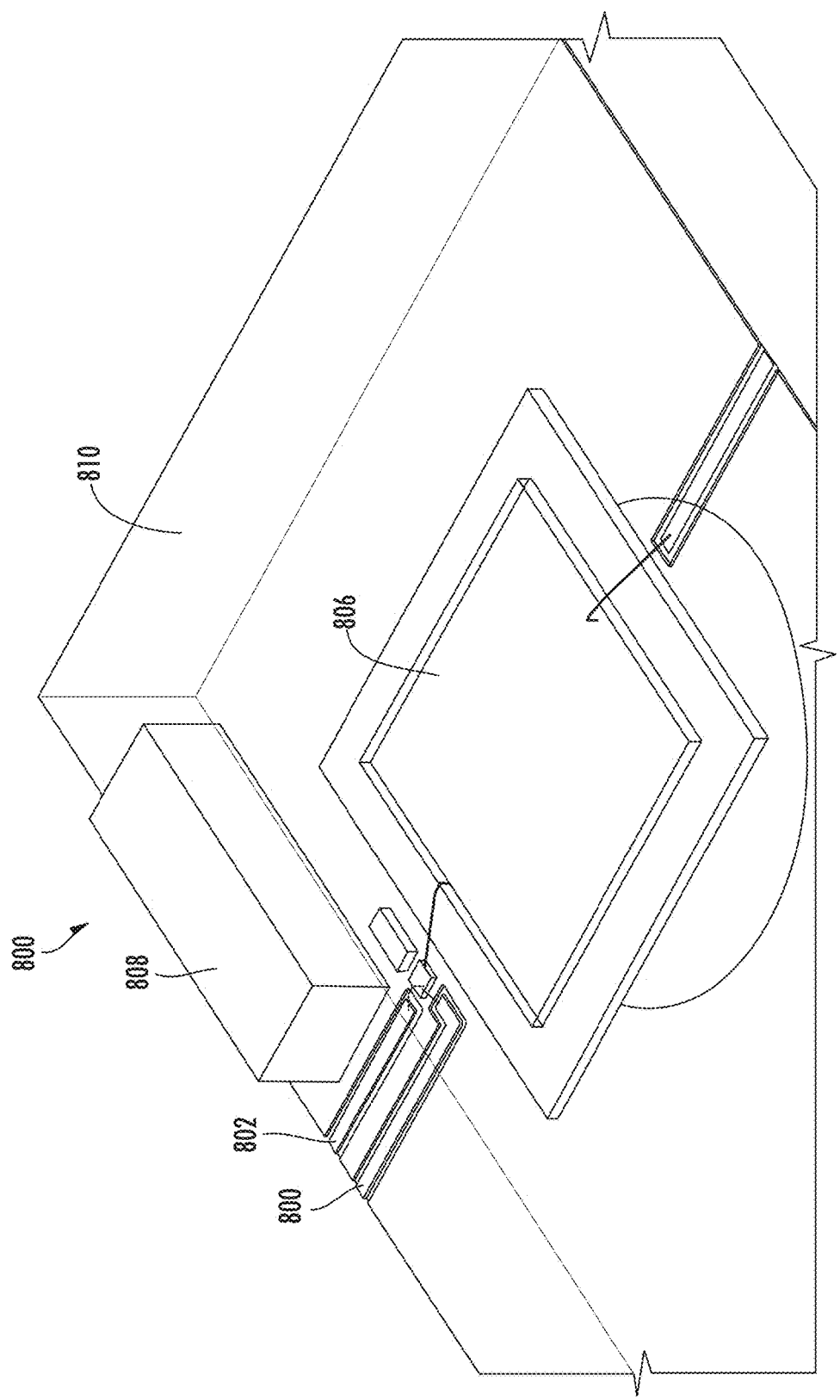
FIG. 8 is a perspective view of at least one embodiment of feedback circuitry of the reconfigurable microwave filter of FIG. 1 that utilizes capacitance to pulse width modulation (C2PWM) feedback.
Figure 9:
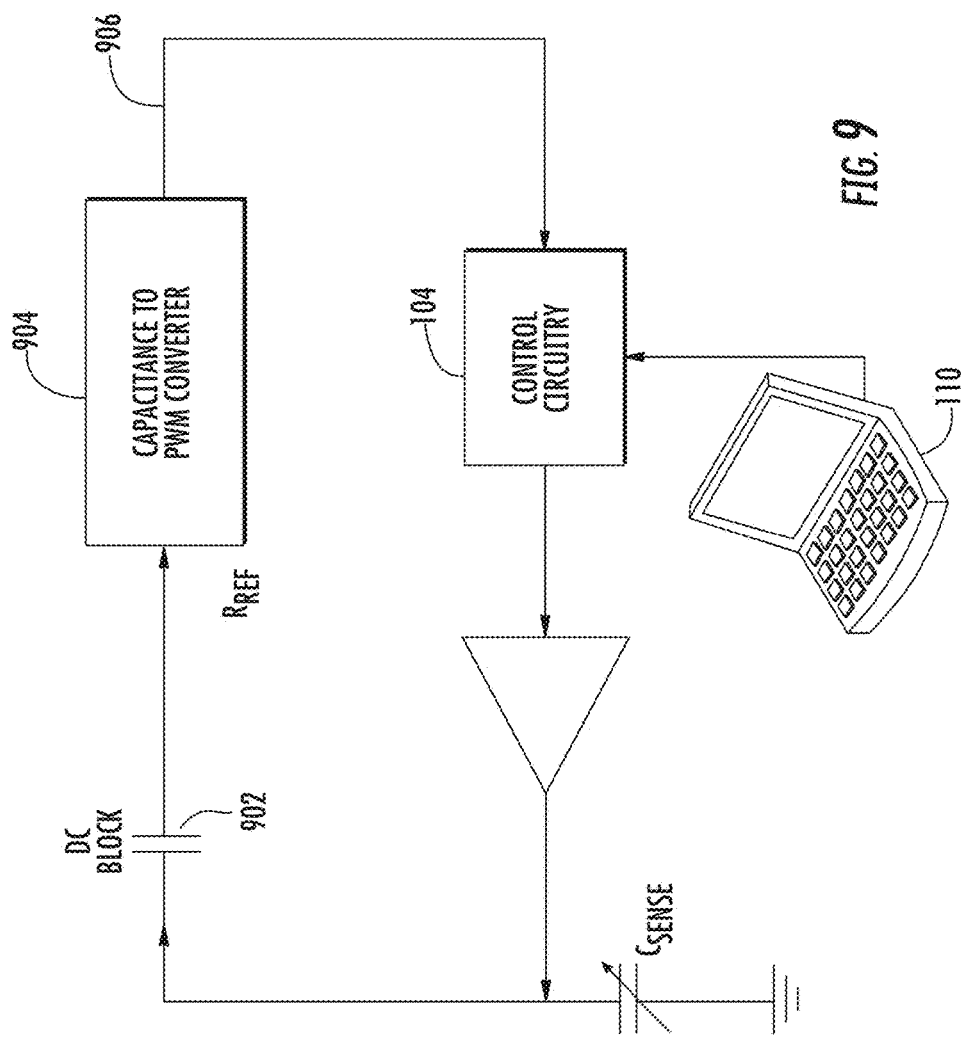
FIG. 9 is a simplified circuit diagram illustrating the feedback circuitry of FIG. 8.

As discussed above, the reconfigurable microwave filter 100 may utilize various feedback circuits 114 depending on the particular embodiment. Referring now to FIGS. 8-9, one or more of the feedback circuits 114 may be configured to utilize capacitance to pulse width modulation (C2PWM) feedback. An exemplary hardware layout 800 for utilizing C2PWM feedback is shown in FIG. 8. The illustrative hardware layout 800 includes a sensor bias 802 and a sensor output 804 electrically coupled to a MEMS RF tuner 806, and a crystal oscillator 808 arranged on a filter substrate 810.

As described above in reference to FIG. 5, a bias voltage may be supplied by a control circuit 112 to the bias electrode 506, and the MEMS membrane 502 may be connected to ground. As the bias voltage increases, the electrostatic force moves the MEMS membrane 502 closer to the bias electrode 506. As the gap 504 between the MEMS membrane 502 and the center post 208 decreases, the capacitance ($C_{GAP}$) increases and the capacitance ($C_{SENSE}$) decreases. Accordingly, the capacitance ($C_{GAP}$) and the capacitance ($C_{SENSE}$) are inversely proportional. In some embodiments, the feedback circuit 114 may be embodied as shown in FIG. 9. That is, the bias electrode 506 may be electrically coupled to a DC blocking capacitor 902, which may be electrically coupled to a C2PWM converter 904. In some embodiments, the C2PWM converter 904 may be embodied as an Application Specific Integrated Circuit (ASIC) or similar device. It will be appreciated that the converter 904 may convert the sensed capacitance ($C_{SENSE}$) to a PWM output signal 906. In some embodiments, as the sensed capacitance ($C_{SENSE}$) decreases, the pulse width decreases and as the sensed capacitance ($C_{SENSE}$) increases, the pulse width increases. As described above, the generated feedback signal (e.g., PWM output signal 906 or a modified version thereof) may be transmitted/supplied to the control circuitry 104 (e.g., for closed loop control).

Figure 10:
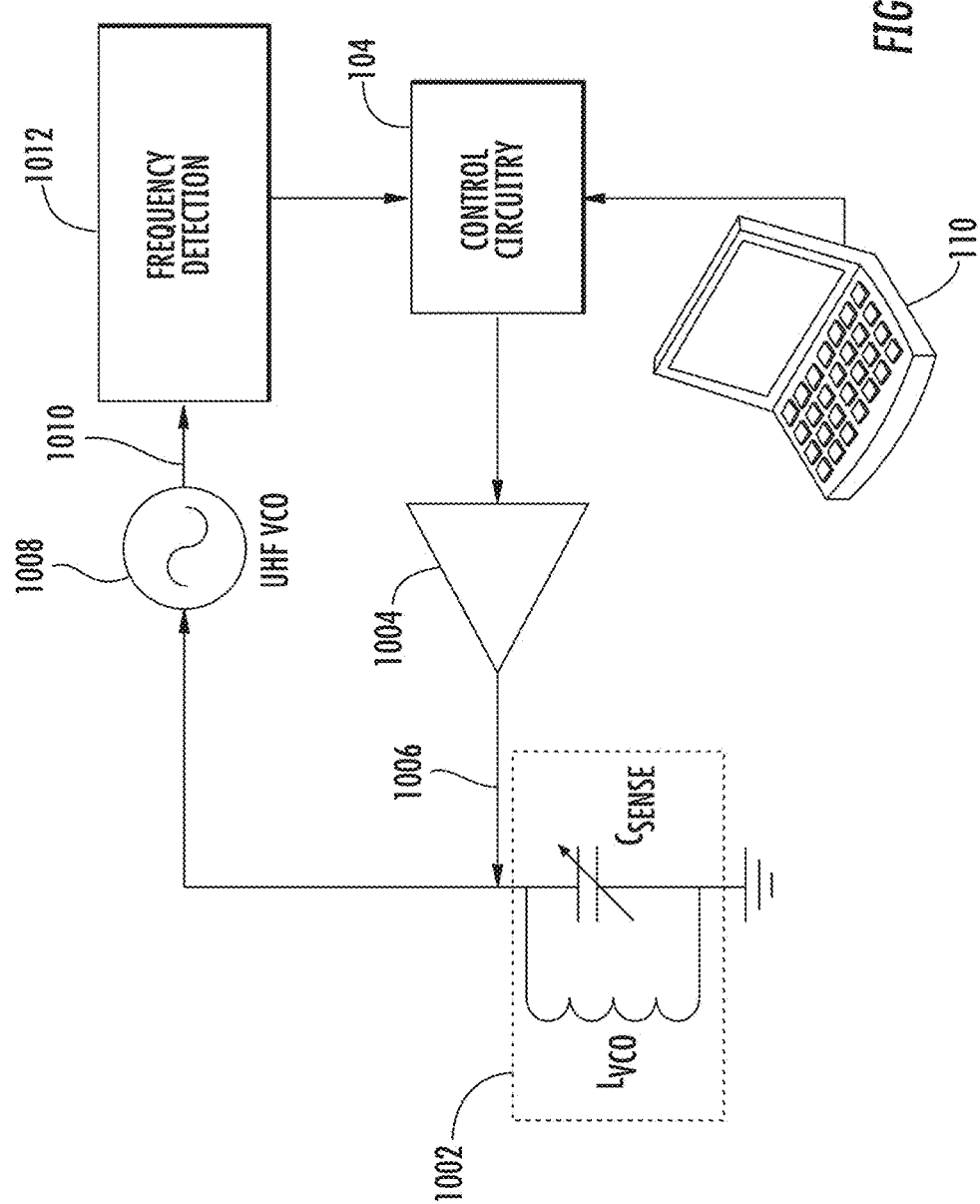
FIG. 10 is a simplified circuit diagram of at least one embodiment of the feedback circuitry of the reconfigurable microwave filter of FIG. 1 that utilizes voltage controlled oscillator (VCO) feedback.

Referring now to FIG. 10, a feedback circuit 114 using voltage control oscillator (VCO) feedback is shown. In such embodiments, a high quality (Q) inductance ($L_{VCO}$) may be placed in parallel with the sensed capacitance ($C_{SENSE}$) described above. It will be appreciated that the inductance ($L_{VCO}$) and the capacitance ($C_{SENSE}$) collectively form a resonant tank circuit 1002. In the illustrative embodiment, the value of the inductance ($L_{VCO}$) is selected in order to cause the resonant tank circuit 1002 to resonate at a particular frequency or within a particular frequency band. For example, in some embodiments, the inductance ($L_{VCO}$) is selected to cause the resonant tank circuit 1002 to resonate in the UHF frequency band (300 MHz-3.0 GHz), which is typically a lower frequency than the resonant frequency of the cavity resonator 102. Of course, other frequency bands may be utilized in other embodiments.

In operation, the control circuitry 104 may supply a control signal to a high voltage amplifier 1004, which may generate a DC output 1006 that is applied to the resonant tank circuit 1002. As described above, the resonant tank circuit 1002 will oscillate at its resonant frequency. In the illustrative embodiment, a voltage controlled oscillator 1008 (e.g., a UHF VCO) amplifies the resonant frequency of the resonant tank circuit 1002. An output 1010 of the voltage controlled oscillator 1008 indicative of the frequency is determined by a frequency detection circuit 1012 and transmitted to the control circuitry 104. It will be appreciated that, in some embodiments, the frequency detection circuit 1012 may form a portion of a control circuit 112 of the control circuitry 104. The control circuitry 104 may calculate the value of the sensed capacitance ($C_{SENSE}$) given the known inductance ($L_{VCO}$) and the detected resonant frequency of the resonant tank circuit 1002. As described above, the control circuitry 104 may determine whether a particular cavity resonator 102 is tuned to the desired frequency by comparing the calculated/determined resonant frequency (e.g., based on the capacitance ($C_{SENSE}$)) with the desired or target resonant frequency provided by the host system 110 (e.g., via user input).

In some embodiments, the correlation between the resonant frequency of the resonant tank circuit 1002 and the resonant frequency of a particular cavity resonator 102 may be affected by environmental characteristics including, for example, temperature, humidity, altitude, vibration, and/or other environment characteristics. As such, in some embodiments, sensors (not shown) may be secured to the reconfigurable microwave filter 100 to measure such environmental characteristics and provide the sensed data to the control circuitry 104. Of course, in such embodiments, the control circuitry 104 may consider such factors in determining the resonant frequency of a particular cavity resonator 102.

Referring now to FIGS. 11A-12B, a feedback circuit 114 for using RF injection feedback is shown. In particular, in the illustrative embodiment of FIGS. 11A-12B, RF injection feedback is used in conjunction with the piezoelectric capacitance control technique described above in reference to FIG. 4. In other embodiments, however, the RF injection feedback techniques described herein may be used in conjunction with other control circuits 112 (e.g., MEMS). As shown in FIGS. 11A-12B, an interdigitated capacitor sensor 1102 is positioned above the piezoelectric actuator 402 and is capacitively coupled with the piezoelectric actuator 402. In such embodiments, an RF input signal 1104 (e.g., a 250 MHz 2-volt peak-to-peak signal) may be injected into the input of the interdigitated capacitor sensor 1102.

Figure 12B:
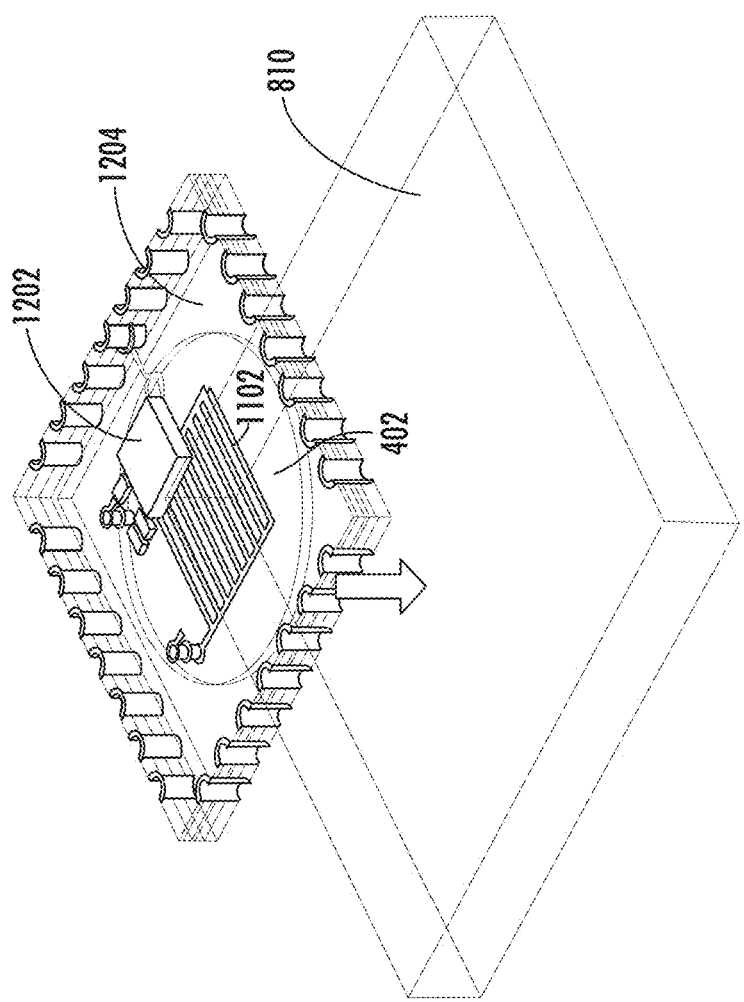
FIG. 12B is an assembly view of the feedback circuitry of FIG. 11A.
Figure 12A:
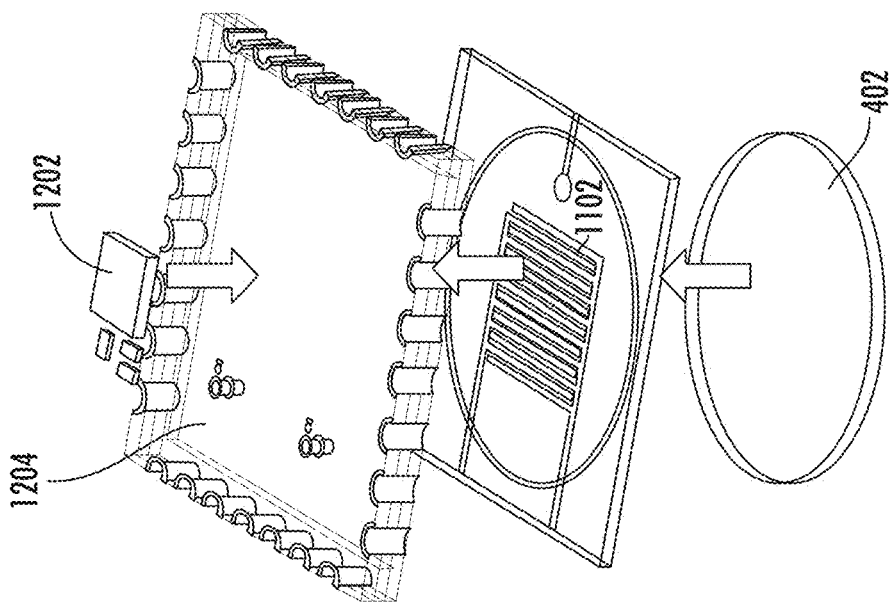
FIG. 12A is an exploded view of the feedback circuitry of FIG. 11A.
Figure 13:
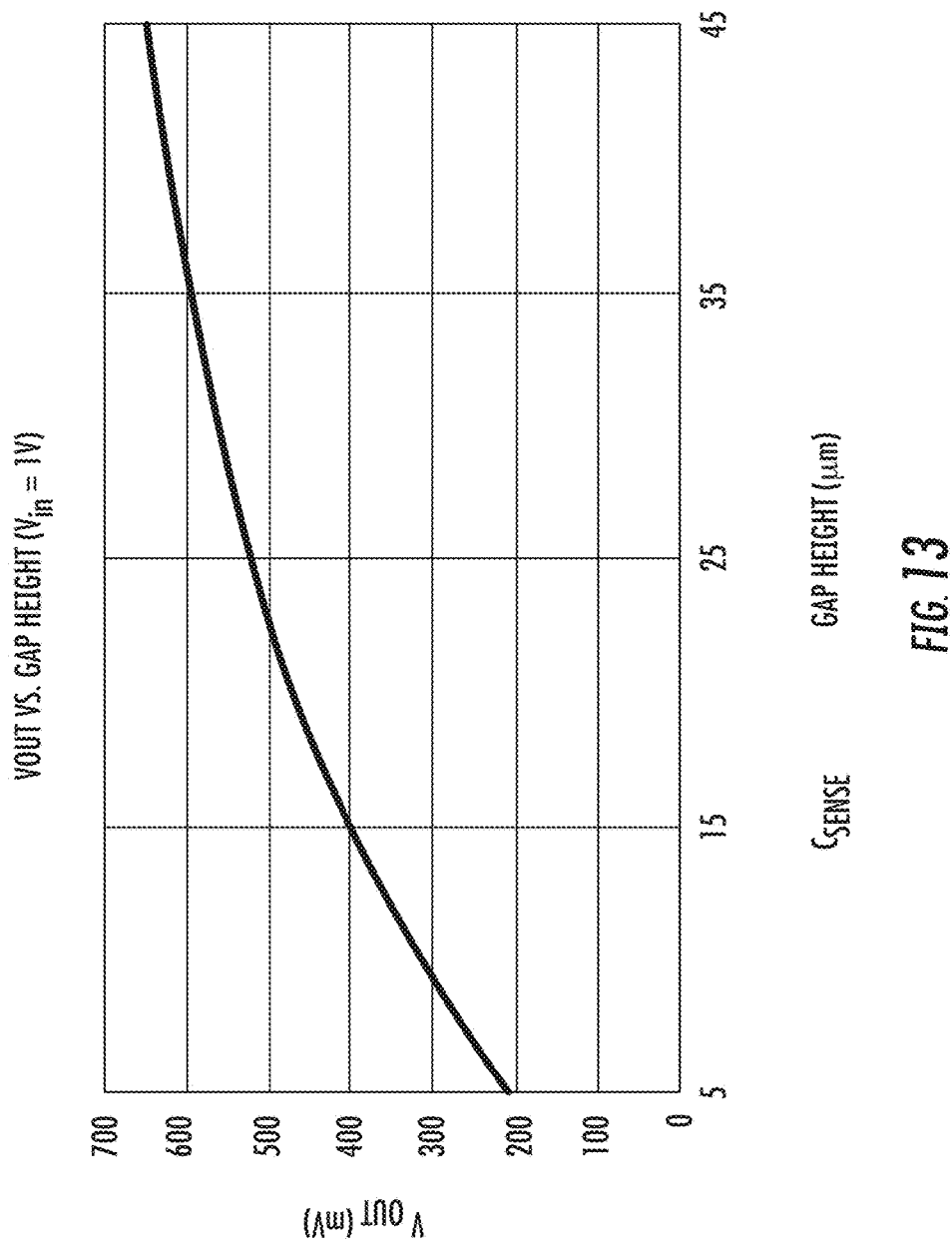
FIG. 13 is a simplified graph illustrating a relationship between a capacitance sensed by the feedback circuitry of FIG. 11A and a voltage output by the feedback circuitry.

A sensed capacitance ($C_{SENSE}$) similar to that described above is formed between the interdigitated capacitor sensor 1102 and a top 1106 of the piezoelectric actuator 402 and is determined by a gap 1108 height between the interdigitated capacitor sensor 1102 and the top 1106 of the piezoelectric actuator 402. It will be appreciated that as the gap 1108 height increases, the output voltage ($V_{OUT}$) of the interdigitated capacitor sensor 1102 increases and as the gap 1108 height decreases, the output voltage ($V_{OUT}$) of the interdigitated capacitor sensor 1102 decreases. In some embodiments, the output voltage ($V_{OUT}$) varies with the sensed capacitance ($C_{SENSE}$) as shown in the graph of FIG. 13. In operation, the output voltage ($V_{OUT}$) of the interdigitated capacitor sensor 1102 may be measured by an RMS-to-DC converter 1202. It will be appreciated that the sensed capacitance ($C_{SENSE}$) can be determined by the control circuitry 104 based on the known output voltage ($V_{OUT}$) of the interdigitated capacitor sensor 1102. As discussed above, once the sensed capacitance ($C_{SENSE}$) is known, the gap capacitance ($C_{GAP}$) can be determined, which may be utilized in determined the resonant frequency of a particular cavity resonator 102. As shown in FIG. 12, the piezoelectric actuator 402, the interdigitated capacitor sensor 1102, and the RMS-to-DC converter 1202 may be fabricated into a multilayer substrate 1204 (e.g., a PCB board) and/or the filter substrate 810.

Figure 14:
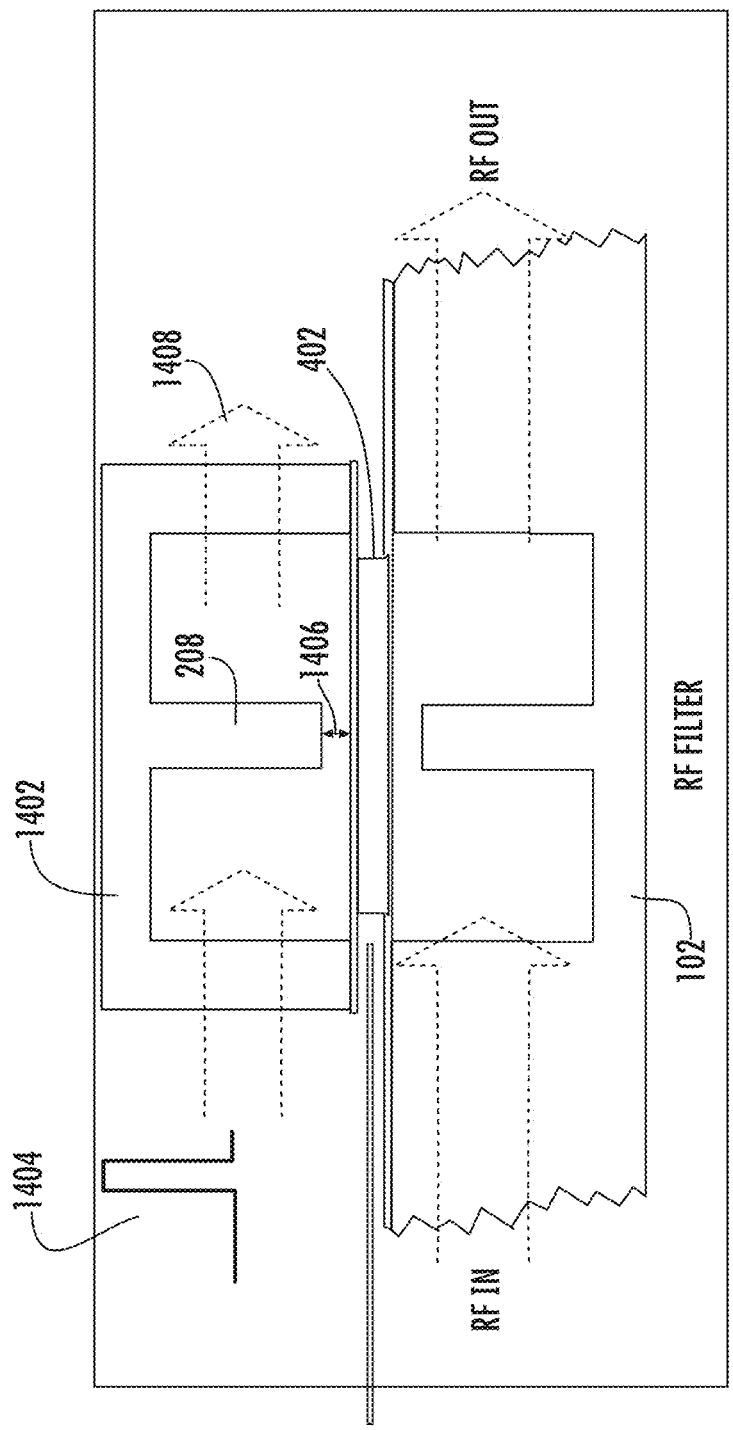
FIG. 14 is a simplified diagram of at least one embodiment of the feedback circuitry of the reconfigurable microwave filter of FIG. 1 that utilizes pulse injection feedback.

Referring now to FIG. 14, a feedback circuit 114 for using pulse injection feedback is shown. In the illustrative embodiment of FIG. 14, pulse injection feedback is used in conjunction with the piezoelectric capacitance control technique described above in reference to FIG. 4. In other embodiments, however, the pulse injection feedback techniques described herein may be used in conjunction with other control circuits 112 (e.g., MEMS). In the illustrative embodiment, the conductive cap 410 described above may be replaced by a secondary cavity resonator 1402 such that the secondary cavity resonator 1402 sits on top of the primary cavity resonator 102 (e.g., mirrored over the primary secondary cavity resonator 102) for which a determination of its resonant frequency is desired as shown in FIG. 14. In some embodiments, a pulsed signal 1404 (e.g., DC pulse) may be injected into the secondary cavity resonator 1402. It will be appreciated that, because the pulsed signal 1404 has a sharp rising and falling end, the pulsed signal 1404 is composed of many different component frequencies. The pulsed signal 1404 causes the secondary cavity resonator 1402 to resonate at its resonant frequency, which may be determined by a sensed capacitance ($C_{SENSE}$) of an air gap 1406 between the top of the piezoelectric actuator 402 and the center post 208 of the secondary cavity resonator 1402. As described above in reference the piezoelectric actuator 402, the sensed capacitance ($C_{SENSE}$) and the gap capacitance ($C_{GAP}$) are inversely proportional.

In the illustrative embodiment, an output 1408 of the secondary cavity resonator 1402 is a decaying sinusoidal waveform at the resonant frequency of the secondary cavity resonator 1402. In some embodiments, the output 1408 may be passed through a limiting amplifier and a frequency counter in order to determine the resonant frequency of the secondary cavity resonator 1402 (e.g., components of the feedback circuitry 106 or, more specifically, the corresponding feedback circuit 114). Based on the resonant frequency of the secondary cavity resonator 1402, the sensed capacitance ($C_{SENSE}$) may be calculated. Accordingly, as described above, the sensed capacitance ($C_{SENSE}$) may be used to calculate the gap capacitance ($C_{GAP}$) and the resonant frequency of the corresponding cavity resonator 102.

Figure 15:
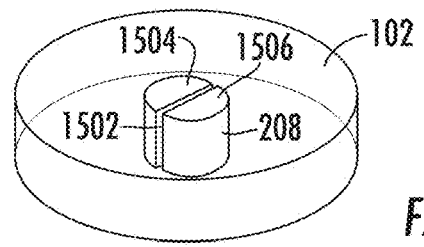
FIG. 15 is a simplified perspective view of at least one embodiment of a cavity resonator of the reconfigurable microwave filter of FIG. 1 that has a split center post.
Figure 16:
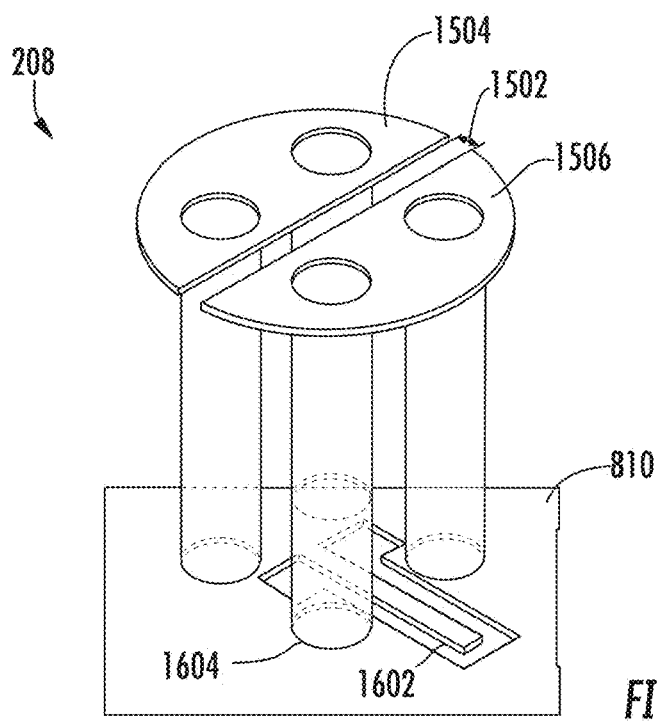
FIG. 16 is a simplified perspective view of another embodiment of a split center post that can be used in the cavity resonators of the reconfigurable microwave filter of FIG. 1.
Figure 17:
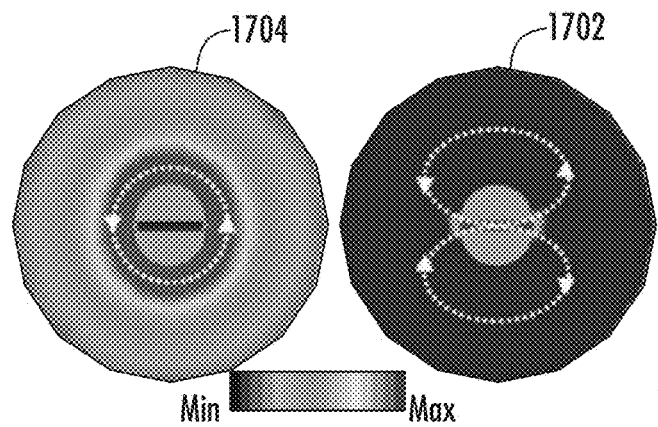
FIG. 17 is a simplified diagram of the cavity resonators of FIGS. 15 and 16, illustrating different modes resulting from the split center posts.
Figure 18:
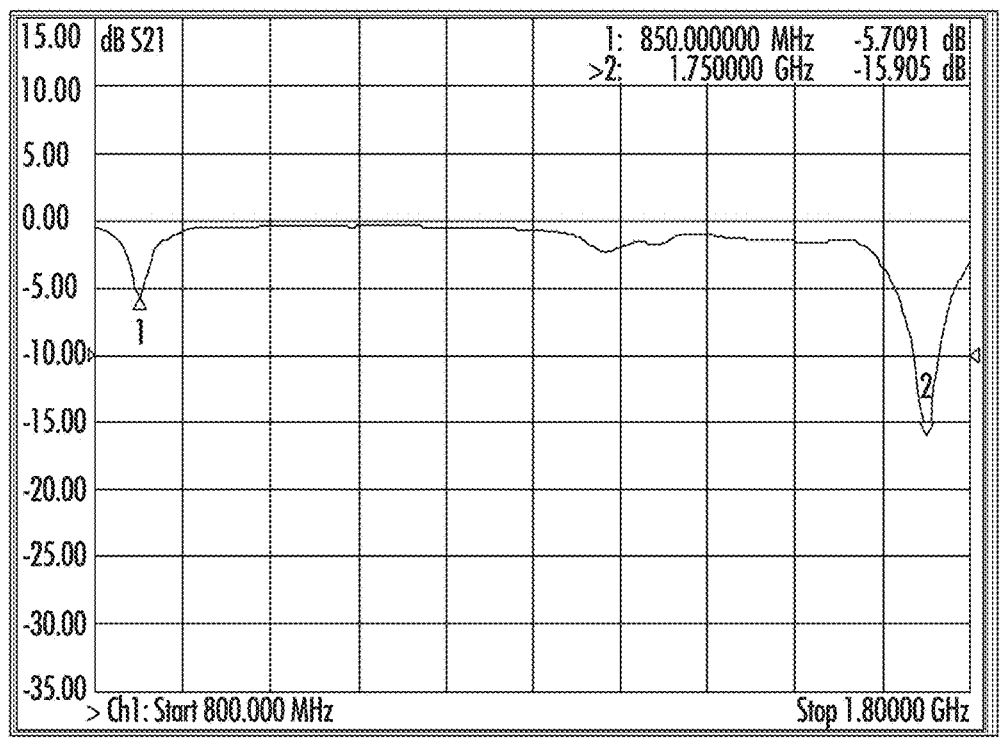
FIGS. 18-25 is simplified graphs of various illustrative response curves that can be realized using the reconfigurable microwave filter of FIG. 1.
Figure 19:
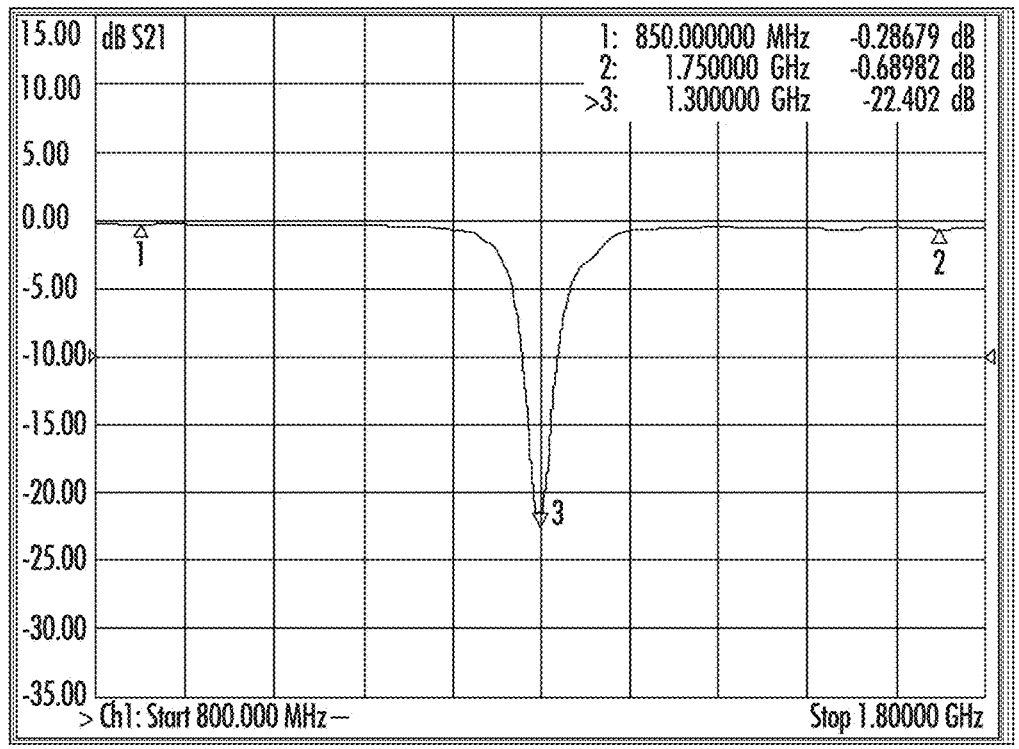
Figure 20:
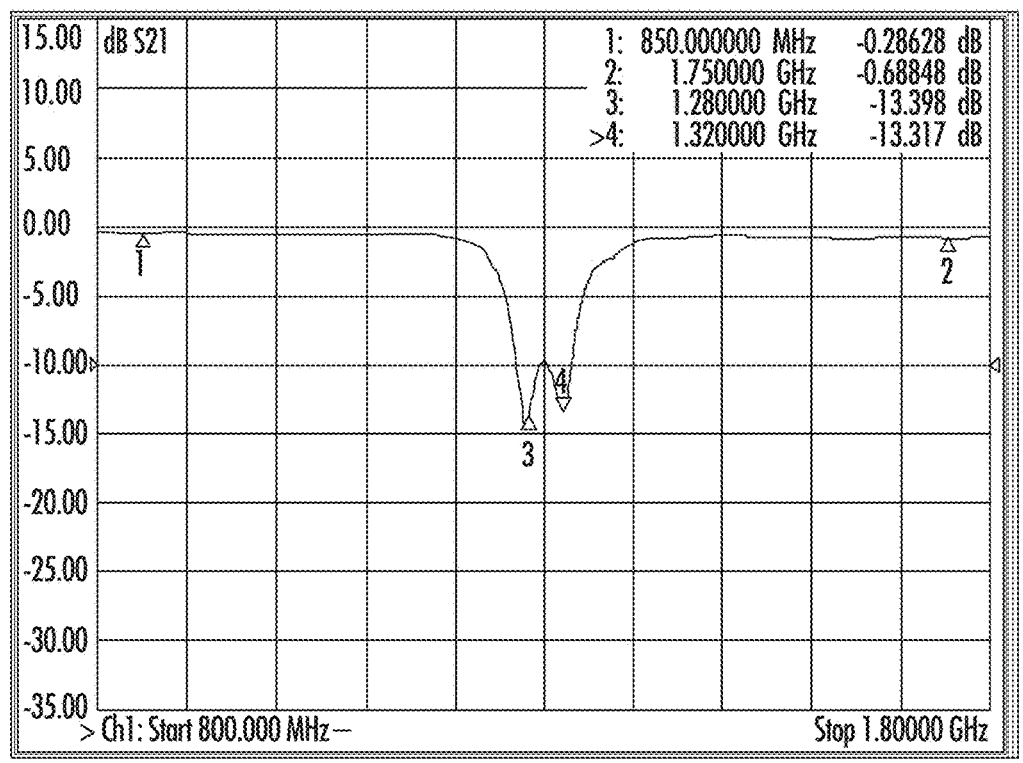
Figure 21:
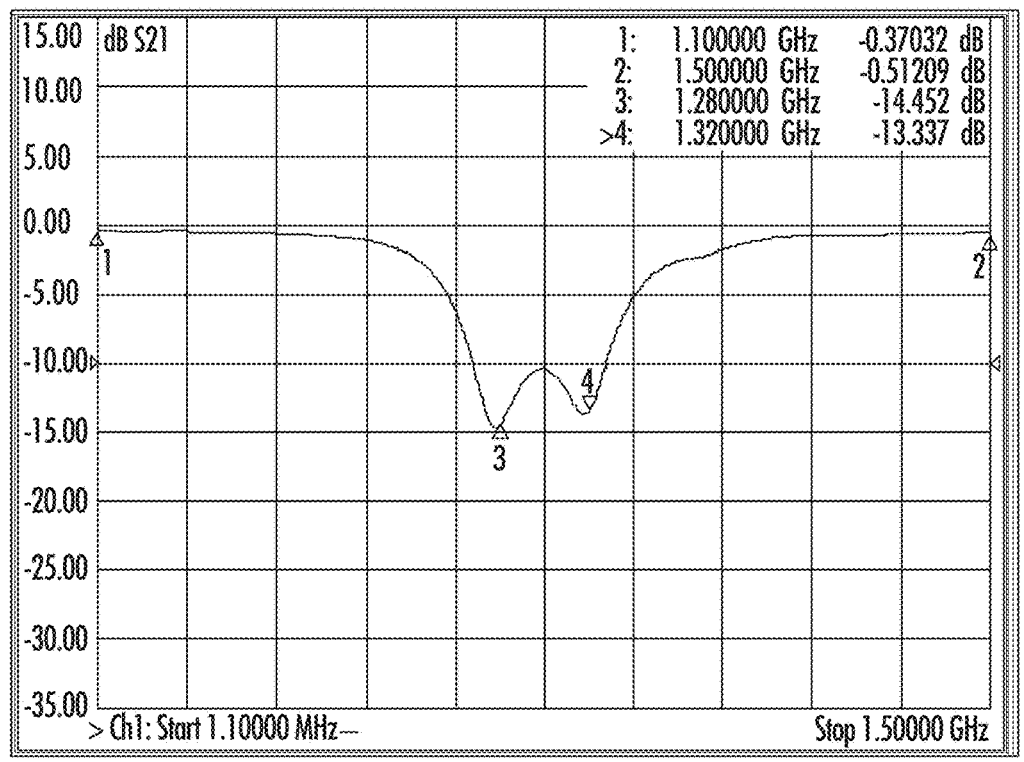
Figure 22:
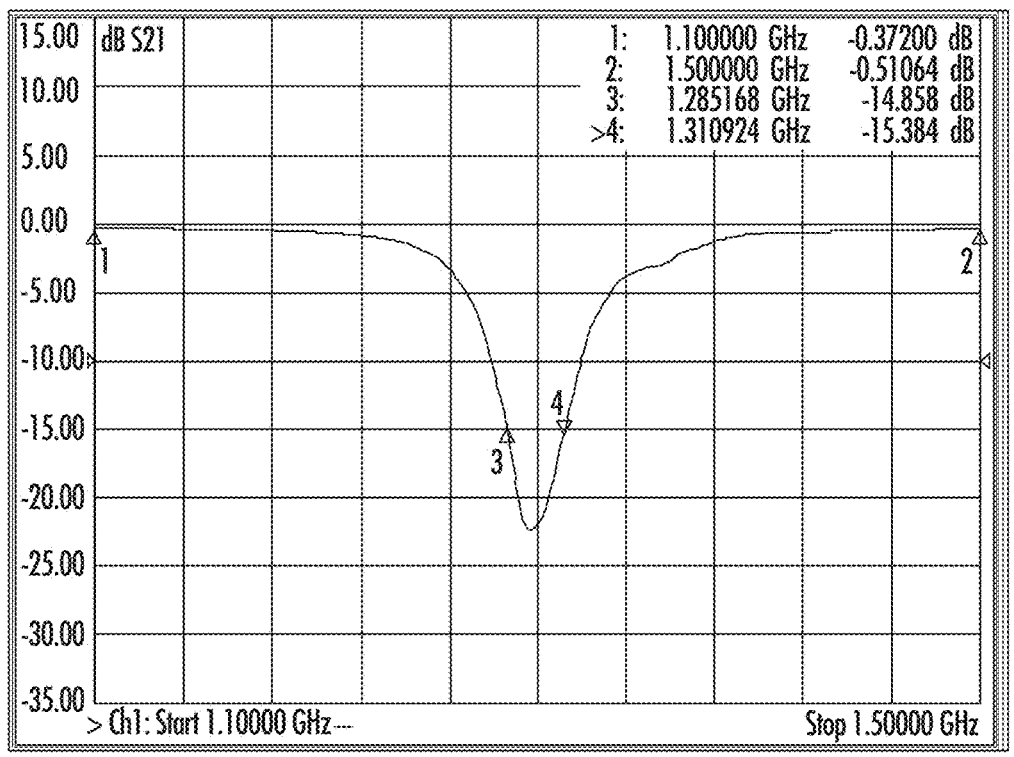
Figure 23:
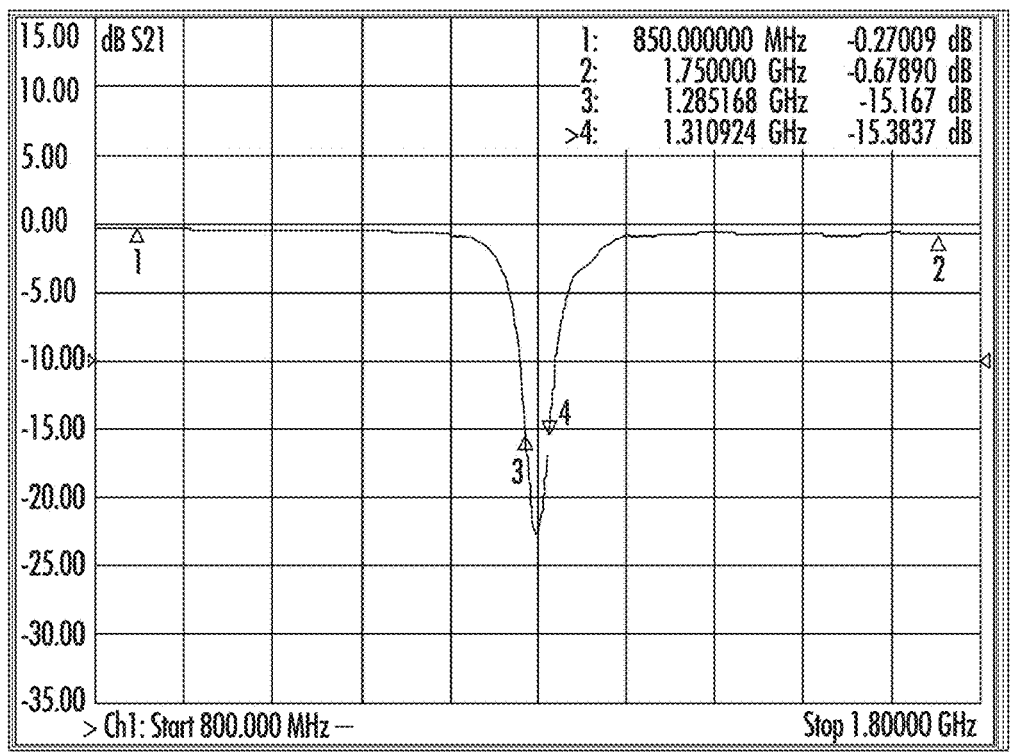
Figure 24:
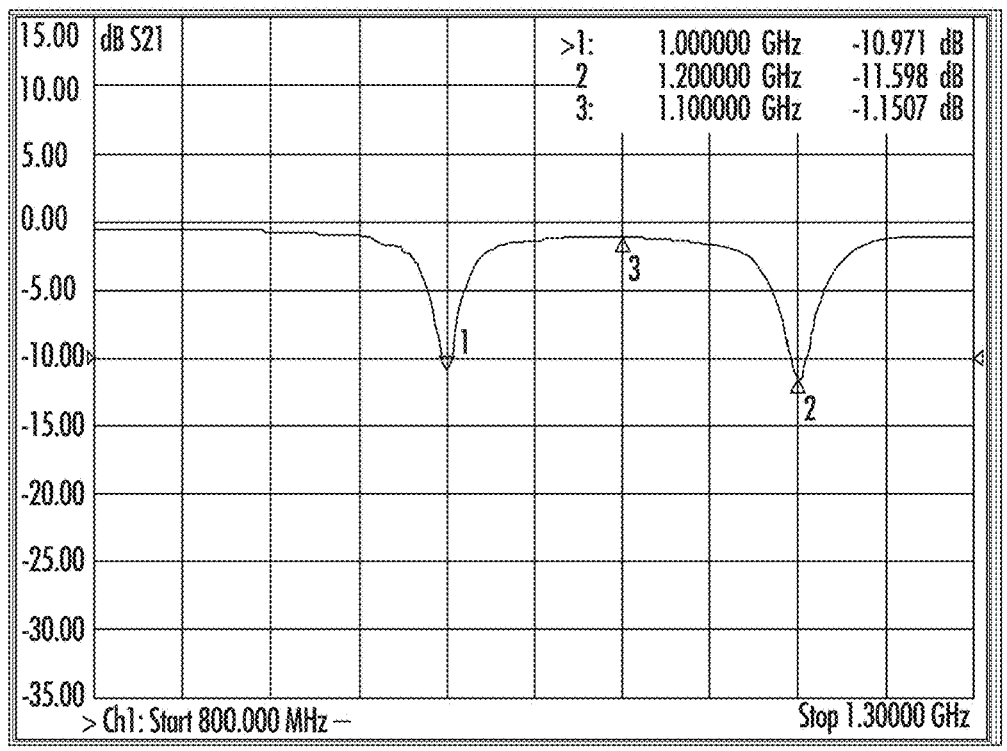
Figure 25:
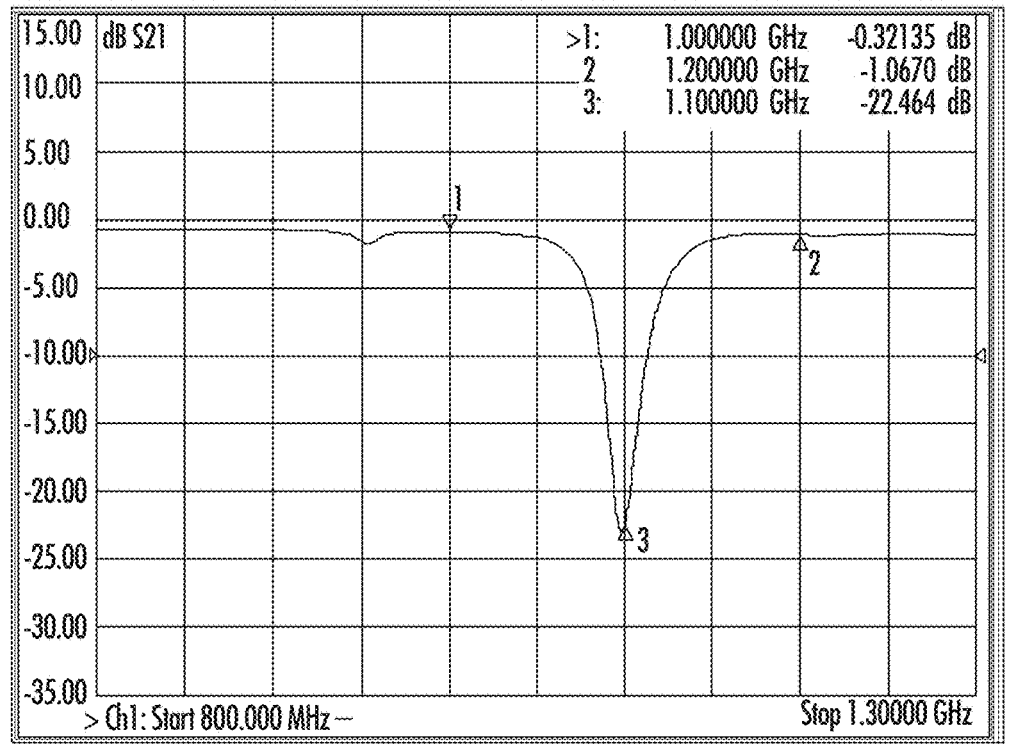

Referring now to FIGS. 15-17, a cavity resonator 102 that includes a split center post 208 is shown. In such embodiments, it will be appreciated that split post feedback techniques may be used by a corresponding feedback circuit 114. As shown in FIGS. 15-17, the center post 208 of a cavity resonator 102 may be split, allowing a differential mode 1702 to co-exist with a common mode 1704 (see FIG. 17). The common mode 1704 is the resonant frequency of the cavity resonator 102, whereas the differential mode 1702 is a higher frequency than the common mode frequency. In various embodiments, the split post feedback technique may be used, for example, in conjunction with the piezoelectric actuation or MEMS techniques described above. As shown in FIGS. 15-16, the center post 208 may be split longitudinally such that a gap 1502 is defined between a first section 1504 and a second section 1506 of the center post 208. In various embodiments, the gap 1502 may be an air gap or may comprise a dielectric material disposed between the first and second sections 1504, 1506 of the center post 208. While the split post 208 is illustratively shown as including two sections 1504, 1506 in FIGS. 15-17, it is contemplated that the gap 1502 may divide the split post 208 into any number of sections in other embodiments.

In some embodiments, a differential mode monitoring port 1602 such as, for example, a slot coupling aperture may be fabricated into the filter substrate 810 at a base 1604 of the center post 208 as shown in FIG. 16. In the illustrative embodiment, the common mode 1704 lies within the designed frequency band of the reconfigurable microwave filter 100, and the differential mode 1702 lies outside of the designed frequency band of the reconfigurable microwave filter 100. Accordingly, it will be appreciated that monitoring the differential mode 1702 does not negatively affect the performance of the reconfigurable microwave filter 100. In some embodiments, the frequency of the differential mode 1702 may be determined using feedback circuitry 106 such as the limiting amplifier and frequency counter described above. The frequency of the differential mode 1702 may be transmitted to the control circuitry 104 or, more specifically, the corresponding control circuit 112. Given a known differential mode 1702 frequency, the common mode 1704 frequency may be calculated, and the control circuitry 104 may adjust the actuation voltage of the corresponding cavity resonator 102 to attain the desired resonant frequency (e.g., based on the programmed user input received from the host system 110).

It will be appreciated that any of the feedback circuits 114 may be used in conjunction with any of the control circuits 112 in order to control the operation of a particular cavity resonator 102 depending on the particular embodiment. For example, the piezoelectric actuation or MEMS techniques described herein may be used in conjunction with C2PWM feedback, VCO feedback, RF injection feedback, pulsed injection feedback, split post feedback, and/or figure of merit optimization. Further, in some embodiments, one or more of the control circuits 112 (e.g., varactors) may be used without a corresponding feedback circuit 114 (e.g., by using lookup tables for control). Further still, in some embodiments, figure of merit optimization (FMO) can be used with any of the control circuits 112 described herein, in place of or in combination with any of the other feedback circuits 114 described herein.

Referring now to FIGS. 18-25, simplified graphs of illustrative response curves realized by the reconfigurable microwave filter 100 based on programmed resonant frequencies of the corresponding cavity resonators 102 are shown. As indicated above, the number of cavity resonators 102 in the reconfigurable microwave filter 100 dictates the number of poles. It will be appreciated that each of the reconfigurable microwave filter 100 of FIGS. 18-25 includes two poles and acts as a two-pole bandstop filter (e.g., notch filter). For example, the reconfigurable microwave filter 100 of FIG. 18 includes two poles or cavity resonators 102 such that one of the poles or cavity resonators 102 is tuned to 850 MHz and the other cavity resonator 102 is tuned to 1.75 GHz. The reconfigurable microwave filter 100 of FIG. 19 includes two cavity resonators 102, each of which is tuned to 1.3 GHz. The reconfigurable microwave filters 100 of FIGS. 20-21 each includes a cavity resonator 102 tuned to 1.28 GHz and another cavity resonator 102 tuned to 1.32 GHz. The reconfigurable microwave filters 100 of FIGS. 22-23 each includes two cavity resonators 102 tuned to 1.3 GHz. The reconfigurable microwave filter 100 of FIG. 24 includes a first cavity resonator 102 tuned to 1.0 GHz and a second cavity resonator 102 tuned to 1.2 GHz. The reconfigurable microwave filter 100 of FIG. 25 includes two cavity resonators 102, each of which is tuned to 1.1 GHz.

While certain illustrative embodiments have been described in detail in the figures and the foregoing description, such an illustration and description is to be considered as exemplary and not restrictive in character, it being understood that only illustrative embodiments have been shown and described and that all changes and modifications that come within the spirit of the disclosure are desired to be protected.

There is a plurality of advantages of the present disclosure arising from the various features of the apparatus, systems, and methods described herein. It will be noted that alternative embodiments of the apparatus, systems, and methods of the present disclosure may not include all of the features described yet still benefit from at least some of the advantages of such features. Those of ordinary skill in the art may readily devise their own implementations of the apparatus, systems, and methods that incorporate one or more of the features of the present disclosure.

The invention claimed is:

1. A reconfigurable microwave filter comprising:
   a plurality of cavity resonators electrically coupled in series;
   a plurality of control circuits, each control circuit of the plurality of control circuits being (i) capacitively coupled to a corresponding cavity resonator of the plurality of cavity resonators and (ii) configured to control a resonant frequency of the corresponding cavity resonator by varying a capacitance of a center post of the corresponding cavity resonator; and
   a plurality of feedback circuits, each feedback circuit of the plurality of feedback circuits being (i) associated with a corresponding cavity resonator of the plurality of cavity resonators and (ii) configured to generate a feedback signal that is indicative of the resonant frequency of the corresponding cavity resonator and to transmit the feedback signal to the respective control circuit of the plurality of control circuits that is capacitively coupled to the corresponding cavity resonator;
   wherein each control circuit of the plurality of control circuits is further configured to (i) compare the received feedback signal to a control signal received from a host system, the control signal being indicative of a desired resonant frequency of the corresponding cavity resonator, and (ii) adjust the resonant frequency of the corresponding cavity resonator based on the comparison.

2. The reconfigurable microwave filter of claim 1, wherein each control circuit comprises a piezoelectric actuator capacitively coupled to the corresponding cavity resonator.

3. The reconfigurable microwave filter of claim 2, wherein each feedback circuit is configured to sense a capacitance associated with the corresponding piezoelectric actuator and to modulate a pulse width of the feedback signal based on the sensed capacitance.

4. The reconfigurable microwave filter of claim 2, wherein each feedback circuit comprises an inductance that forms a resonant tank circuit with a capacitance associated with the corresponding piezoelectric actuator, each feedback circuit being configured to generate the feedback signal based on the resonant frequency of the resonant tank circuit.

5. The reconfigurable microwave filter of claim 2, wherein each feedback circuit comprises an interdigitated capacitor sensor capacitively coupled to the corresponding piezoelectric actuator, each feedback circuit being configured to generate the feedback signal based on a capacitance of the interdigitated capacitor.

6. The reconfigurable microwave filter of claim 2, wherein each feedback circuit comprises an additional cavity resonator, the corresponding piezoelectric actuator also being capacitively coupled to the additional cavity resonator of the associated feedback circuit, each feedback circuit being configured to generate the feedback signal based on a resonant frequency of the additional cavity resonator.

7. The reconfigurable microwave filter of claim 1, wherein each control circuit comprises a micro-electromechanical systems (MEMS) membrane capacitively coupled to the corresponding cavity resonator.

8. The reconfigurable microwave filter of claim 7, wherein the MEMS membrane comprises a segmented MEMS membrane including a plurality of MEMS membranes.

9. The reconfigurable microwave filter of claim 7, wherein each feedback circuit is configured to sense a capacitance associated with the corresponding MEMS membrane and to modulate a pulse width of the feedback signal based on the sensed capacitance.

10. The reconfigurable microwave filter of claim 7, wherein each feedback circuit comprises an inductance that forms a resonant tank circuit with a capacitance associated with the corresponding MEMS membrane, each feedback circuit being configured to generate the feedback signal based on the resonant frequency of the resonant tank circuit.

11. The reconfigurable microwave filter of claim 7, wherein each feedback circuit comprises an interdigitated capacitor sensor capacitively coupled to the corresponding MEMS membrane, each feedback circuit being configured to generate the feedback signal based on a capacitance of the interdigitated capacitor.

12. The reconfigurable microwave filter of claim 7, wherein each feedback circuit comprises an additional cavity resonator, the corresponding MEMS membrane also being capacitively coupled to the additional cavity resonator of the associated feedback circuit, each feedback circuit being configured to generate the feedback signal based on a resonant frequency of the additional cavity resonator.

13. The reconfigurable microwave filter of claim 1, wherein:
   the center post of the corresponding cavity resonator is a split post divided by a gap into a plurality of sections; and
   the feedback signal is based on a measurement of a differential mode of the corresponding cavity resonator.

14. The reconfigurable microwave filter of claim 1, wherein each control circuit of the plurality of control circuits is configured to control the resonant frequency of the corresponding cavity resonator independent of control of each other cavity resonator.

15. The reconfigurable microwave filter of claim 1, wherein:

a first control circuit of the plurality of control circuits is configured to control a resonant frequency of a first cavity resonator of the plurality of cavity resonators; and a second control circuit of the plurality of control circuits is configured to control a resonant frequency of a second cavity resonator of the plurality of cavity resonators independent of the control of the resonant frequency of the first cavity resonator.

16. The reconfigurable microwave filter of claim 15, wherein the second control circuit is configured to control the resonant frequency of the second cavity resonator to be different from the resonant frequency of the first cavity resonator.

17. A method of operating a reconfigurable microwave filter, the method comprising:

receiving, by a control circuit, a control signal indicative of a desired resonant frequency of a cavity resonator from a host system;

controlling, by the control circuit, a resonant frequency of the cavity resonator based on the desired resonant frequency of the cavity resonator;

measuring, by a feedback circuit, a capacitance associated with the control circuit, wherein the measured capacitance is indicative of the resonant frequency of the cavity resonator;

generating, by the feedback circuit, a feedback signal that is indicative of the resonant frequency of the cavity resonator; and adjusting, by the control circuit, the resonant frequency of the cavity resonator based on at least the feedback signal.

18. The method of claim 17, wherein adjusting the resonant frequency of the cavity resonator comprises:

comparing the feedback signal to the control signal; and adjusting the resonant frequency of the cavity resonator based on the comparison of the feedback signal to the control signal.

19. An electronic system comprising:

a reconfigurable microwave filter including (i) a plurality of cavity resonators on a common substrate and (ii) a plurality of control circuits, each control circuit of the plurality of control circuits being configured to independently control a resonant frequency of a corresponding cavity resonator of the plurality of cavity resonators;

wherein each control circuit is configured to (i) receive, from a feedback circuit of the electronic system, a feedback signal indicative of at least one of a bit-error rate associated with the electronic system and a signal-to-noise ratio associated with the electronic system and (ii) adjust the resonant frequency of the corresponding cavity resonator based on the received feedback signal.

20. The electronic system of claim 19, wherein each cavity resonator comprises a plurality of solid state varactors.

21. The electronic system of claim 19, wherein each control circuit comprises a piezoelectric actuator capacitively coupled to the corresponding cavity resonator.

22. The electronic system of claim 19, wherein each control circuit comprises a micro-electro-mechanical systems (MEMS) membrane capacitively coupled to the corresponding cavity resonator.

23. The electronic system of claim 19, wherein the plurality of cavity resonators are electrically coupled in series.

24. The electronic system of claim 19, wherein the plurality of cavity resonators are electrically coupled in parallel.

25. The electronic system of claim 19, wherein the plurality of cavity resonators are electrically coupled in a series-parallel configuration.

* * * * *